*(12)* United States Patent
Tabata et al.

(10) Patent No.: US 9,202,533 B2
(45) Date of Patent: Dec. 1, 2015

(54) NONVOLATILE SEMICONDUCTOR MEMORY DEVICE CHANGING THE NUMBER OF SELECTED BITS AND/OR THE NUMBER OF SELECTED BAYS AT DATA WRITE OPERATION

(71) Applicant: Kabushiki Kaisha Toshiba, Minato-ku (JP)

(72) Inventors: Hideyuki Tabata, Yokkaichi (JP); Takayuki Tsukamoto, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 36 days.

(21) Appl. No.: 14/156,613

(22) Filed: Jan. 16, 2014

(65) Prior Publication Data

US 2015/0098261 A1    Apr. 9, 2015

Related U.S. Application Data

(60) Provisional application No. 61/888,619, filed on Oct. 9, 2013.

(51) Int. Cl.
| | |
|---|---|
| *G11C 7/10* | (2006.01) |
| *G11C 29/34* | (2006.01) |
| *G11C 13/00* | (2006.01) |
| *G11C 29/02* | (2006.01) |
| *G11C 29/52* | (2006.01) |

(52) U.S. Cl.
CPC .............. *G11C 7/1042* (2013.01); *G11C 29/34* (2013.01); *G11C 13/0002* (2013.01); *G11C 13/0007* (2013.01); *G11C 13/0061* (2013.01); *G11C 13/0069* (2013.01); *G11C 29/028* (2013.01); *G11C 29/52* (2013.01); *G11C 2013/0085* (2013.01); *G11C 2013/0088* (2013.01); *G11C 2213/70* (2013.01); *G11C 2213/71* (2013.01)

(58) Field of Classification Search
CPC ................ G11C 7/1042; G11C 29/34; G11C 2013/0085; G11C 2013/0088; G11C 2213/70; G11C 2213/71
See application file for complete search history.

(56) References Cited

U.S. PATENT DOCUMENTS

| | | | |
|---|---|---|---|
| 5,287,470 A | * | 2/1994 | Simpson ........................ 345/540 |
| 6,512,683 B2 | * | 1/2003 | Hsu et al. ..................... 365/49.1 |
| 7,554,832 B2 | | 6/2009 | Fasoli et al. |

(Continued)

FOREIGN PATENT DOCUMENTS

| | | |
|---|---|---|
| JP | 2009-545835 | 12/2009 |
| JP | 2012-501038 | 1/2012 |

*Primary Examiner* — Vanthu Nguyen
(74) *Attorney, Agent, or Firm* — Oblon, McClelland, Maier & Neustadt, L.L.P.

(57) ABSTRACT

A nonvolatile semiconductor memory device comprises: a memory cell array including first interconnections, second interconnections intersecting the first interconnections, and memory cells having a variable resistance element and being provided at respective intersections of the first interconnections and the second interconnections, the memory cell array being divided into bays including a predetermined number of the memory cells; and a control circuit configured to execute a first write step and a second write step executed after the first write step at a data writing operation, wherein the control circuit is configured to change over the number of simultaneously selected bits and/or the number of simultaneously selected bays depending upon whether a write step is the first write step or the second write step.

20 Claims, 22 Drawing Sheets

(56) References Cited

U.S. PATENT DOCUMENTS

| | | | |
|---|---|---|---|
| 7,631,138 B2* | 12/2009 | Gonzalez et al. | 711/103 |
| 8,130,528 B2 | 3/2012 | Yan et al. | |
| 8,478,928 B2* | 7/2013 | Lee et al. | 711/103 |
| 8,972,627 B2* | 3/2015 | Strasser et al. | 710/48 |
| 2012/0224409 A1 | 9/2012 | Yan et al. | |
| 2012/0275210 A1 | 11/2012 | Yan et al. | |

* cited by examiner

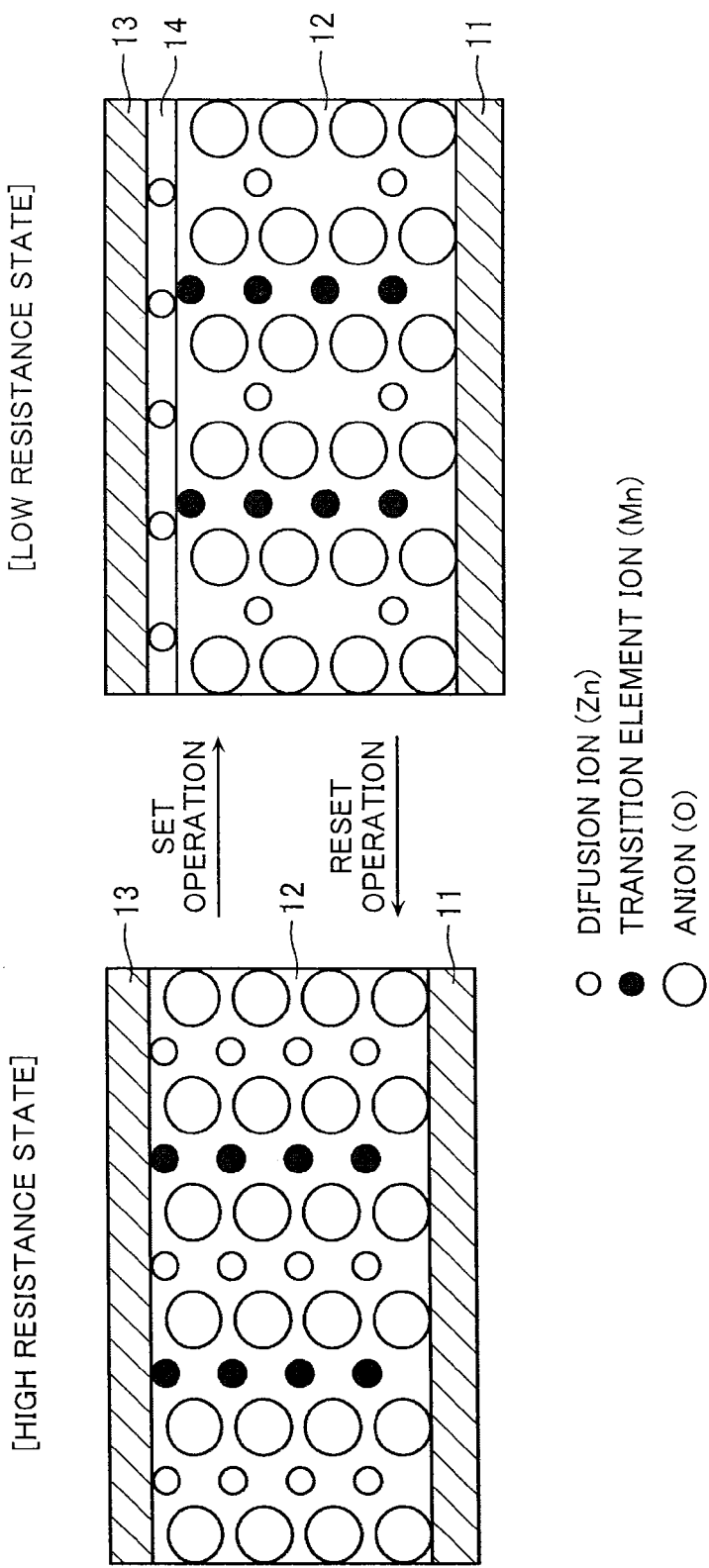

FIG. 5

| BAY ADDRESS | 1 | | | | | | | | 2 | | | | | | | |
|---|---|---|---|---|---|---|---|---|---|---|---|---|---|---|---|---|
| COLUMN ADDRESS | 1 | | | | 2 | | | | 1 | | | | 2 | | | |
| SA ADDRESS | 1 | 2 | 3 | 4 | 1 | 2 | 3 | 4 | 1 | 2 | 3 | 4 | 1 | 2 | 3 | 4 |
| PAGE ADDRESS | 1 | 2 | 3 | 4 | 5 | 6 | 7 | 8 | 9 | 10 | 11 | 12 | 13 | 14 | 15 | 16 |

FIG. 7
|  | FIRST RESET STEP | SECOND RESET STEP |
|---|---|---|
| NUMBER OF SIMULTANOUSLY SELECTED BITS | 4 | 4 |
| NUMBER OF SIMULTANOUSLY SELECTED BAYS | 2 | 1 |
FIG. 8
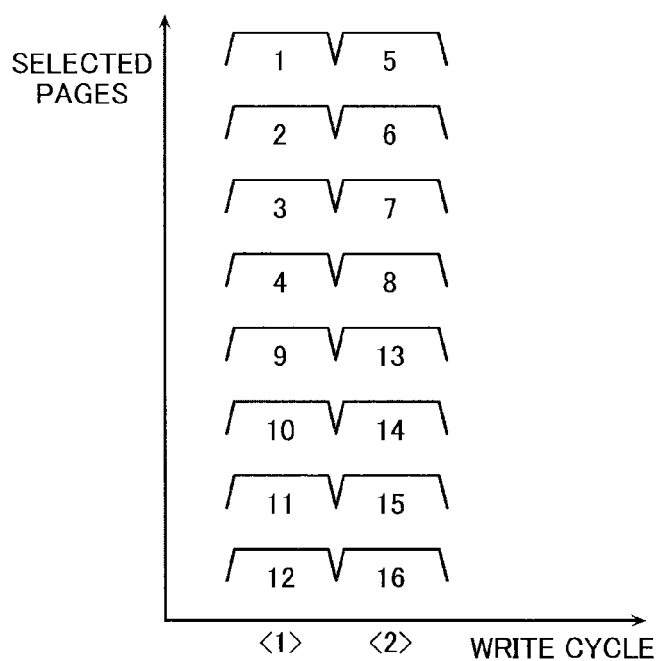
FIG. 9
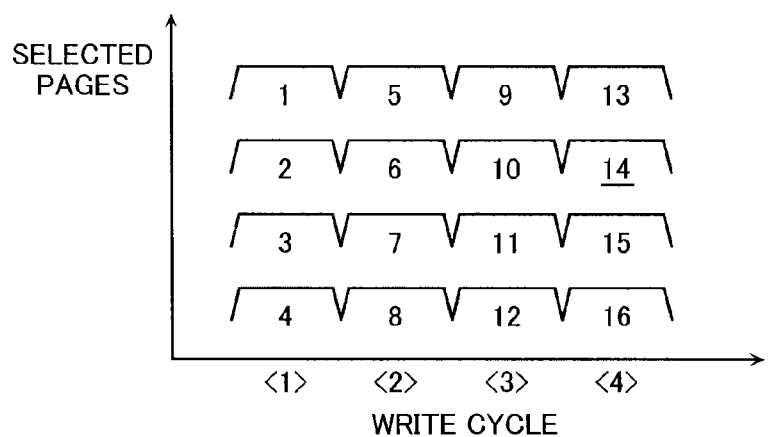

| PAGE ADDRESS | WRITE DATA | READ DATA |
|---|---|---|
| 1 | 0 | 0 |
| 2 | 1 | 1 |
| 3 | 1 | 1 |
| 4 | 0 | 0 |
| 5 | 1 | 1 |
| 6 | 0 | 0 |
| 7 | 1 | 1 |
| 8 | 0 | 0 |
| 9 | 1 | 1 |
| 10 | 0 | 0 |
| 11 | 0 | 0 |
| 12 | 1 | 1 |
| 13 | 0 | 0 |
| 14 | 0 | 1 |
| 15 | 1 | 0 |
| 16 | 0 | 0 |

FIG. 12
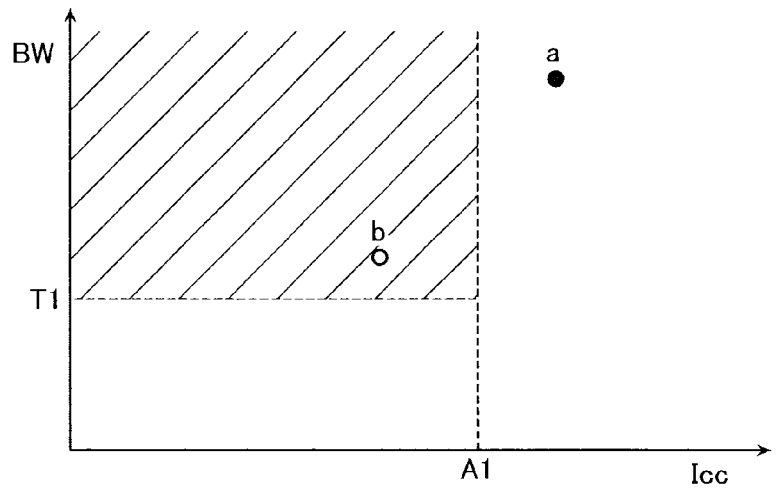
FIG. 13
|  | FIRST SET STEP | SELECTED BITS |
|---|---|---|
| NUMBER OF SIMULTANOUSLY SELECTED BITS | 1 | 4 |
| NUMBER OF SIMULTANOUSLY SELECTED BAYS | 2 | 2 |
FIG. 14
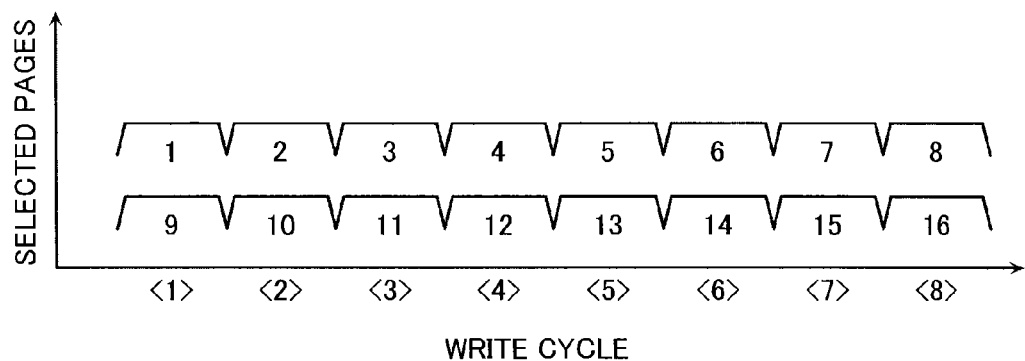

| PAGE ADRESS | WRITE DATA | READ DATA |
|---|---|---|
| 1 | 0 | 0 |
| 2 | 1 | 1 |
| 3 | 1 | 1 |
| 4 | 0 | 0 |
| 5 | 1 | 1 |
| 6 | 0 | 0 |
| 7 | 1 | 1 |
| 8 | 0 | 0 |
| 9 | 1 | 1 |
| 10 | 0 | 0 |
| 11 | 0 | 0 |
| 12 | 1 | 1 |
| 13 | 0 | 0 |
| 14 | 0 | 1 |
| 15 | 1 | 0 |
| 16 | 0 | 0 |

| PAGE ADRESS | WRITE DATA | READ DATA |
|---|---|---|
| 1 | 0 | 0 |
| 2 | 1 | 0 |
| 3 | 1 | 0 |
| 4 | 0 | 0 |
| 5 | 1 | 0 |
| 6 | 0 | 0 |
| 7 | 1 | 0 |
| 8 | 0 | 0 |
| 9 | 1 | 0 |
| 10 | 0 | 0 |
| 11 | 0 | 0 |
| 12 | 1 | 0 |
| 13 | 0 | 0 |
| 14 | 0 | 0 |
| 15 | 1 | 0 |
| 16 | 0 | 0 |

NONVOLATILE SEMICONDUCTOR MEMORY DEVICE CHANGING THE NUMBER OF SELECTED BITS AND/OR THE NUMBER OF SELECTED BAYS AT DATA WRITE OPERATION

CROSS-REFERENCE TO RELATED APPLICATIONS

This application is based upon and claims the benefit of priority from the prior U.S. Provisional Application 61/888,619, filed on Oct. 9, 2013, the entire contents of which are incorporated herein by reference.

BACKGROUND

1. Field

The present invention relates to a nonvolatile semiconductor memory device.

2. Description of the Related Art

In recent years, a resistance change memory using variable resistance elements in memory cells has been proposed as a technique for attempting size shrinking of memory cells. In the case of the resistance change memory, memory cells may be formed as a cross-point type, and consequently it becomes easy to constitute a memory cell array having a three-dimensional structure.

Among such resistance change memories, a memory cell array is partitioned into several bays and data is written into selected memory cells in a selected bay simultaneously.

It is important to suppress the current consumption and improve the bandwidth at the time of data writing.

BRIEF DESCRIPTION OF DRAWINGS

FIG. 4 is a diagram showing an example of a variable resistance element in the nonvolatile semiconductor memory device according to the first embodiment;

FIG. 5 is an example of a diagram showing allotment of a bay address, a column address, a sense amplifier address, and a page address in the nonvolatile semiconductor memory device according to the first embodiment;

FIG. 7 is an example of a diagram showing the number of simultaneously selected bits/bays at the time of a reset step in the write sequence in the nonvolatile semiconductor memory device according to the first embodiment;

FIG. 8 is an example of a diagram showing relations between a write cycle and selected pages at the time of a first reset step in the write sequence in the nonvolatile semiconductor memory device according to the first embodiment;

FIG. 9 is an example of a diagram showing relations between a write cycle and selected pages at the time of a second reset step in the write sequence in the nonvolatile semiconductor memory device according to the first embodiment;

FIG. 12 is an example of a diagram showing relations between the current consumption and the bandwidth over the whole time of the reset step in the write sequence in the nonvolatile semiconductor memory device according to the first embodiment;

FIG. 13 is an example of a diagram showing the number of simultaneously selected bits/bays at the time of a set step in a write sequence in a nonvolatile semiconductor memory device according to a second embodiment;

FIG. 14 is an example of a diagram showing relations between a write cycle and selected pages at the time of a first set step in the write sequence in the nonvolatile semiconductor memory device according to the second embodiment;

DETAILED DESCRIPTION

A nonvolatile semiconductor memory device according to the present invention includes: a memory cell array including first interconnections, second interconnections intersecting the first interconnections, and memory cells having a variable resistance element and being provided at respective intersections of the first interconnections and the second interconnections, the memory cell array being divided into bays including a predetermined number of the memory cells; and a control circuit configured to execute a first write step and a second write step executed after the first write step at a data writing operation, wherein, where the number of the bays selected simultaneously is the number of simultaneously selected bays, and the number of the memory cells selected simultaneously in one of the bays is the number of simultaneously selected bits, the control circuit is configured to change over the number of simultaneously selected bits and/or the number of simultaneously selected bays depending upon whether a write step is the first write step or the second write step.

Hereafter, nonvolatile semiconductor memory devices according to embodiments of the present invention will be described with reference to the drawings.

First Embodiment

First, a general configuration of a nonvolatile semiconductor memory device according to a first embodiment will now be described.

Figure 1:
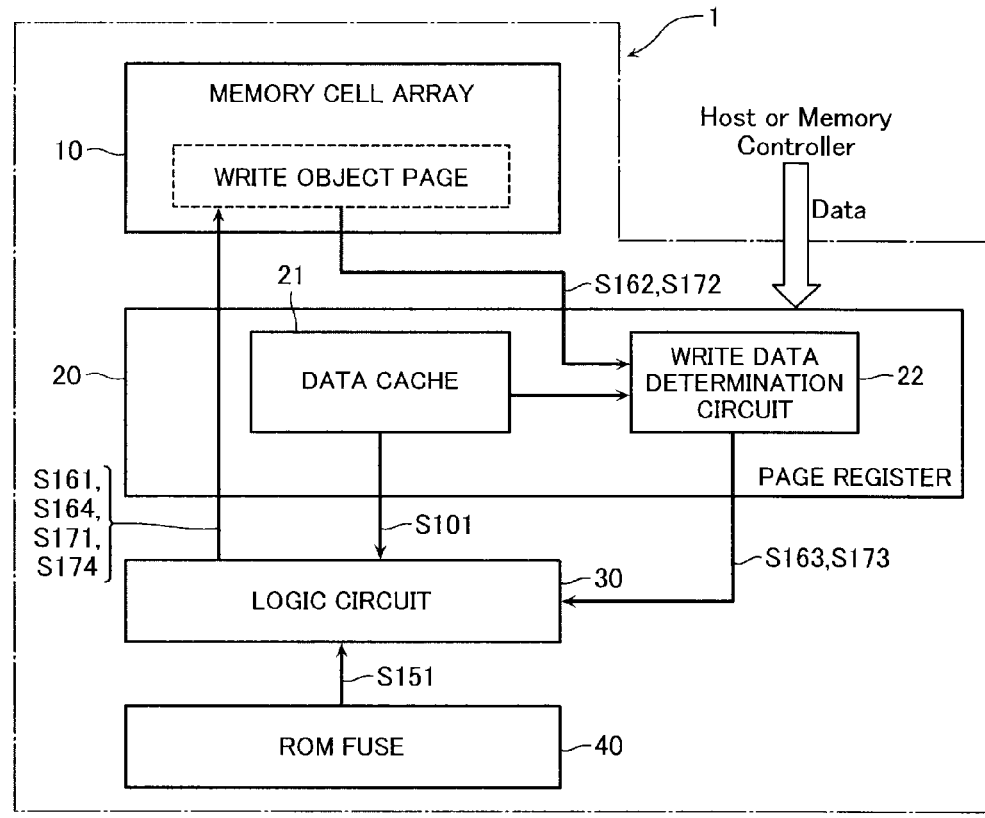
FIG. 1 is an example of a block diagram showing a configuration of a nonvolatile semiconductor memory device according to a first embodiment.

FIG. 1 is an example of a block diagram showing a configuration of a nonvolatile semiconductor memory device according to the present embodiment.

This nonvolatile semiconductor memory device 1 includes a memory cell array 10 configured to store data, a page register 20 configured to store data read from or to be written into the memory cell array 10, a logic circuit 30 configured to control the memory cell array 10 to read/write data while referring to the data stored by the page register 20, and a ROM fuse 40 (data storage element) configured to store a parameter to be used in the control of the memory cell array 10 exercised by the logic circuit 30. Note that the page register 20 and the logic circuit 30 are included in a control circuit.

The memory cell array 10 will now be described.

Figure 2:
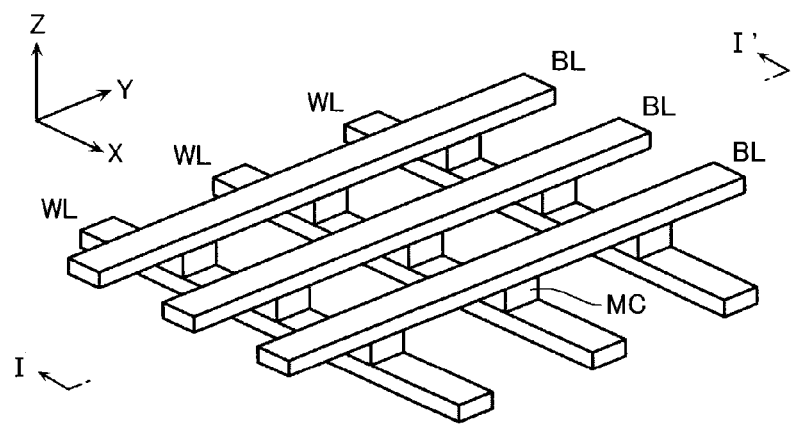
FIG. 2 is an example of an oblique view showing a part of a memory cell array in the nonvolatile semiconductor memory device according to the first embodiment.

FIG. 2 is an oblique view showing a part of the memory cell array in the nonvolatile semiconductor memory device according to the present embodiment. In FIG. 2, an X direction, a Y direction, and a Z direction are also shown as three directions which are orthogonal to each other.

The memory cell array 10 includes a plurality of bit lines BL (first interconnections) extending in the Y direction, a plurality of word lines WL (second interconnections) extending in the X direction, and memory cells MC disposed at respective intersections of the plurality of bit lines BL and the plurality of word lines WL and each sandwiched between a bit line and a word line. As for the bit lines BL and the word lines WL, a material which is resistant to heat and has a low resistance value is desirable. For example, W, WSi, NiSi, or CoSi can be used.

The memory cell MC will now be described.

Figure 3A:
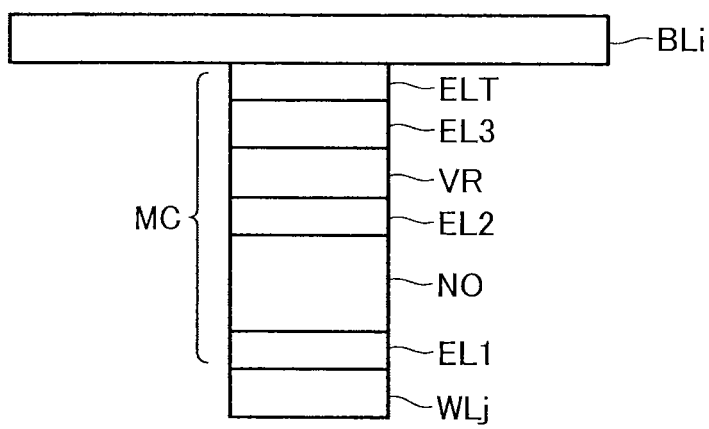
FIG. 3A is an example of a sectional view of one memory cell in the nonvolatile semiconductor memory device according to the first embodiment.
Figure 3B:
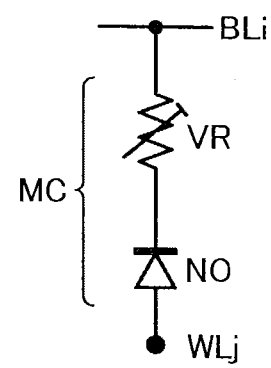
FIG. 3B is an example of an equivalent circuit diagram of a memory cell in the nonvolatile semiconductor memory device according to the first embodiment.

FIGS. 3A and 3B are a sectional view of a memory cell in the semiconductor memory device according to the present embodiment and an equivalent circuit diagram of the memory cell. FIG. 3A is an example of a sectional view of one memory cell in a case where the memory cell array is cut along a line I-I' shown in FIG. 2 and the memory cell array is viewed in a direction indicated by arrows.

As shown in FIG. 3B, the memory cell MC includes a series connection circuit of a variable resistance element VR and a non-ohmic element NO.

A resistance value of the variable resistance element VR can be changed by applying a voltage via, for example, a current, heat, or chemical energy. Electrodes EL2 and EL3 each functioning as a barrier metal and an adhesive layer are disposed below and above the variable resistance element VR, respectively. As the electrode material, for example, Pt, Au, Ag, TiAlN, SrRuO, Ru, RuN, Ir, Co, Ti, TiN, TaN, LaNiO, Al, PrIrO$_x$, PtRhO$_x$, or Rh/TaAlN is used. By the way, a top electrode ELT including, for example, W (tungsten) for making the orientation property uniform may be disposed on the electrode EL3 as shown in FIG. 3A. Furthermore, it is also possible to separately insert, for example, a buffer layer, a barrier metal layer, or an adhesive layer into the memory cell MC.

As for the variable resistance element VR, for example, an element in which a resistance value is changed by a phase transition between a crystalline state and an amorphous state as in chalcogenide, an element in which a resistance of a film is changed by changing a concentration of oxygen in an oxide film; an element in which a resistance value is changed by precipitating metallic cations and forming a conducting bridge between electrodes or ionizing precipitated metal and destroying the conducting bridge, or an element in which a resistance value is changed by applying a voltage or a current (ReRAM) can be used. FIG. 4 is a diagram showing an example of a ReRAM element. The ReRAM element shown in FIG. 4 has a recording layer 12 between electrode layers 11 and 13. The recording layer 12 includes a composite compound having at least two kinds of cation elements. At least one kind of the cation elements is a transition element having a d orbit filled with electrons incompletely. In addition, the shortest distance between adjacent cation elements is set to be 0.32 nm or less. Specifically, a material represented by a chemical formula $A_xM_yX_z$ (A and M are elements which are different from each other) and having a crystal structure such as, for example, the spinel structure ($AM_2O_4$), ilmenite structure ($AMO_3$), delafossite structure ($AMO_2$), LiMoN2 structure ($AMN_2$), wolframite structure ($AMO_4$), olivine structure ($A_2MO_4$), hollandite structure ($A_xMO_2$), ramsdellite structure ($A_xMO_2$), or pevroskite structure ($AMO_2$).

In the example shown in FIG. 4, A is Zn, M is Mn, and X is O. In the recording layer 12, a small white circle represents a diffusion ion (Zn), a large white circle represents an anion (O), and a small black circle represents a transition element ion (Mn). An initial state of the recording layer 12 is a high resistance state. If the electrode layer 11 is connected to a fixed potential and a negative voltage is applied to the electrode layer 13, however, a part of diffusion ions in the recording layer 12 moves to the electrode layer 13 side, and diffusion ions in the recording layer 12 decrease relatively as compared with anions. Diffusion ions that have moved to the electrode layer 13 side receive electrons from the electrode layer 13 and precipitate metal, and consequently, forms a metal layer 14. Within the recording layer 12, anions become excessive. As a result, the valence number of transition element ions within the recording layer 12 is raised. Accordingly, the recording layer 12 gains electron conductivity by injection of carriers, and a set operation is completed. Reproduction can be conducted by letting flow a minute current in which a material forming the recording layer 12 does not cause a resistance change. A program state (low resistance state) can be reset to the initial state (high resistance state) by, for example, letting a large current flow through the recording layer 12 for a sufficient time to cause Joule heating, and promoting oxidation-reduction reaction in the recording layer 12. Furthermore, the reset operation can also be conducted by applying an electric field opposite in direction to that at the time of setting.

The non-ohmic element NO includes a diode such as, for example, a Schottky diode, a PN junction diode, or a PIN diode, or an MIM (Metal-Insulator-Metal) structure or an SIS (Silicon-Insulator-Silicon) structure. The electrodes EL1 and EL2 which forma barrier metal layer and an adhesive layer may be inserted here as well. As the electrode material, for example, Pt, Au, Ag, TiAlN, SrRuO, Ru, RuN, Ir, Co, Ti, TiN, TaN, LaNiO, Al, $PrIrO_x$, $PrRhO_x$, or Rh/TaAlN is used. Ina case where a diode is used, a unipolar operation can be conducted. In the case of the MIM structure or the SIS structure, a bipolar operation can be conducted. By the way, disposition of the non-ohmic element NO and the variable resistance element VR shown in FIGS. 3A and 3B may be made upside down. The polarity of the non-ohmic element NO may be made upside down.

Furthermore, the memory cell MC may have a structure that does not include a diode. For example, a resistance change memory cell of ion type can be used. As a resistance change material, for example, Si in a poly-crystal state or amorphous state, or SiO, SiON, SiN, Ge, SiGe, GaAs, InP, GaP, GaInAsP, GaN, SiC, HfSiO, HfO, or AlO can be used.

As the resistance change material, a laminated film made of the above-described materials can also be used. As an electrode of a resistance change material, for example, an electrode of, for example, Ag, Au, Ti, Ni, Co, Al, Fe, Cr, Cu, W, Hf, Ta, Pt, Ru, Zr or Ir, or its nitride or oxide can be disposed. As the electrode, a material obtained by adding the above-described material to poly-crystal silicon can also be used. Furthermore, it is also possible to insert a stopper layer of TaSiN on an opposite side of the electrode of the resistance change material.

Allotment of a bay addresses, a column address, a sense address and a page addresses in the memory cell array 10 will now be described.

FIG. 5 is a diagram showing an example of allotment of the bay address, the column address, the sense amplifier address, and the page addresses in the nonvolatile semiconductor memory device according to the present embodiment. In FIG. 5, the sense amplifier address is represented as "SA address."

In the example shown in FIG. 5, the memory cell array 10 is partitioned into two bays. These two bays are allotted <1> and <2> as the bay address. In the ensuing description, a case where each of these bays <1> and <2> has eight bits is taken as an example. Here, page is a unit of reading and writing. One page is sixteen bits. One bit corresponds to, for example, memory cells MC connected to one word line WL in common. Eight bits in the bay <1> are allotted <1> to <8> as the page address. Eight bits in the bay <2> are allotted <9> to <16> as the page address. These pages <1> to <16> constitute one column every four bits. A column composed of pages <1> to <4> in the bay <1> and a column composed of pages <9> to <12> in the bay <2> are allotted a common column address <1>. Furthermore, a column composed of pages <5> to <8> in the bay <1> and a column composed of pages <13> to <16> in the bay <2> are allotted a common column address <2>. In addition, these columns <1> and <2> share four sense amplifiers corresponding to respective bits. These four sense amplifiers are allotted sense amplifier addresses <1> to <4>, respectively.

Data writing into the memory cell array 10 will now be described.

Data writing is processed by the above-described components in the nonvolatile semiconductor memory device as described hereafter. The data writing will be described with reference to the example of the block diagram shown in FIG. 1.

First, when write data is input from the outside (a host or a memory controller), the page register 20 stores the write data in a data cache 21 included in the page register 20.

Subsequently, the logic circuit 30 refers to the write data stored by the data cache 21 (step S101). The logic circuit 30 writes the write data into a write object page in the memory cell array 10 by using a write sequence which will be described later (steps S161 and S171 in FIG. 6).

Subsequently, the page register 20 compares read data from the write object page with the write data retained by the data cache 21, by using a write data decision circuit 22 included in the page register 20 (steps S162 and S172 in FIG. 6).

Figure 6:
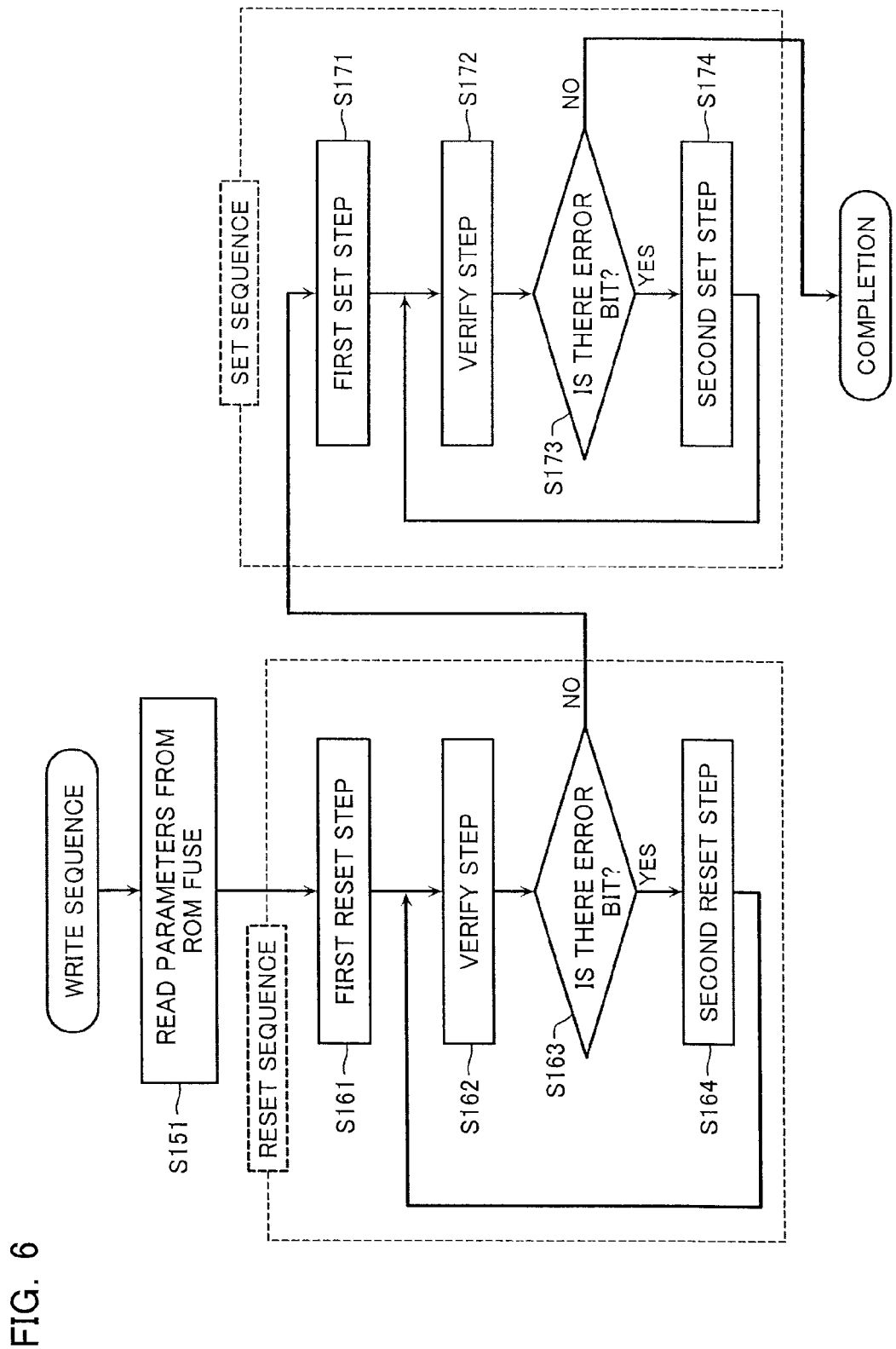
FIG. 6 is an example of a flowchart of a write sequence in the nonvolatile semiconductor memory device according to the first embodiment.

When the read data and the write data coincide with each other as a result of the decision made by the write data determination circuit 22, the data writing is completed (steps S163 and S173 in FIG. 6). On the other hand, when the read data and the write data do not coincide with each other, the logic circuit 30 writes data into the memory cell array 10 again (steps S164 and S174 in FIG. 6).

FIG. 6 is an example of a flow chart of a write sequence in the nonvolatile semiconductor memory device according to the present embodiment.

The write sequence includes a reset sequence and a set sequence which are consecutively executed. The reset sequence is processing for bringing the variable resistance element VR into a reset operation. On the other hand, the set sequence is processing for bringing the variable resistance element VR into a set operation. In a case where a high resistance state and a low resistance state of the variable resistance element VR are respectively allotted to bi-valued data "0" and "1," the reset sequence becomes writing data "0" into the memory cell MC and the set sequence becomes writing data "1" into the memory cell MC.

In the write sequence, first at step S151, parameters to be used in the reset sequence and the set sequence are read out from the ROM fuse 40. These parameters will be described later.

Subsequently, at step S161, a reset step is executed on a write object page for the first time. Here, the reset step means a step of writing data "0" into a memory cell MC having an address where write data is "0," and a step of applying a reset pulse for a reset operation of the variable resistance element VR to the memory cell MC. Hereafter, a reset step executed for the first time in the write sequence is referred to as "first reset step."

Subsequently, at step S162, a verify step is executed on the write object page. The verify step means a step of ascertaining whether data is written into the write object page correctly. At this verify step, it is ascertained whether read data from a memory cell MC having an address where write data is "0" is "0." In a case where there is a memory cell (hereafter may be referred to as "error bit") in which data "0" is not written as a result of this ascertainment, the processing is advanced to step S164 (YES at step S163). On the other hand, in a case where there are no error bits, the processing is advanced to step S171 (NO at the step S163). Here, "a case where there are no error bits" includes a case where there are no error bits taking the ECC into the consideration.

Subsequently, at the step S164, the reset step is executed on the write object page again. Here, a reset pulse is applied only to a memory cell MC determined to be an error bit at the step S162. Hereafter, a reset step executed for a second time or later in the write sequence is referred to as "second reset step." Then, the processing is returned to the step S162.

The above-described steps S161 to S164 are regarded as a reset sequence.

Subsequently, at step S171, a set step is executed on a write object page for the first time. Here, the set step means a step of writing data "1" into a memory cell MC having an address where write data is "1," and a step of applying a set pulse for a set operation of the variable resistance element VR to the memory cell MC. Hereafter, a set step executed for the first time in the write sequence is referred to as "first set step." Furthermore, the first reset step and the first step are collectively may be referred to as "first write step". By the way, the reset pulse and the set pulse are included in write pulses.

Subsequently, at step S172, a verify step is executed on the write object page. At this verify step, it is ascertained whether read data from a memory cell MC having an address where write data is "1" is "1." In a case where there is a memory cell ("error bit") in which data "1" is not written as a result of this ascertainment, the processing is advanced to step S174 (YES at step S173). On the other hand, in a case where there are no error bits, the write sequence is completed (NO at the step S173).

Subsequently, at the step S174, the set step is executed on the write object page again. Here, a set pulse is applied only to a memory cell MC determined to be an error bit at the step S172. Hereafter, a set step executed for a second time or later in the write sequence is referred to as "second set step." Furthermore, the second reset step and the second step may be collectively referred to as "second write step". Then, the processing is returned to the step S172.

The above-described steps S171 to S174 are regarded as a set sequence.

A write step will now be described. The ensuing description is premised on the address allotment shown in FIG. 5. Furthermore, the present embodiment will be described by taking the reset step as an example. However, it is to be noted that the ensuing description can be applied to the set step as well in the same way.

In a single reset step, data writing into pages <1> to <16> is executed by a series of write cycles (hereafter may be referred to simply as "cycle"). In the present embodiment, however, different write cycles are executed at the first reset step and the second reset step. Specifically, the number of bays selected simultaneously (hereafter may be referred to as "the number of simultaneously selected bays") and the number of pages selected simultaneously per bay are changed over according to whether the reset step is the first reset step or the second reset step. In the ensuing description, the number of memory cells per page is supposed to be one. Therefore, the number of pages selected simultaneously per bay may be referred to as "the number of simultaneously selected bits".

FIG. 7 is an example of a diagram showing the number of simultaneously selected bits/bays at the time of the reset step in the write sequence in the nonvolatile semiconductor memory device according to the present embodiment.

In the example shown in FIG. 7, the number of simultaneously selected bits is set equal to 4 and the number of simultaneously selected bays is set equal to 2 at the first reset step, and the number of simultaneously selected bits is set equal to 4 and the number of simultaneously selected bays is set equal to 1 at the second reset step. In other words, the number of simultaneously selected bays at the second reset step is made smaller than that at the first reset step. By the way, these four parameters may be stored in the ROM fuse 40 so that the logic circuit 30 is configured to refer to the parameters at the time of the reset step (the step S151 in FIG. 6). Furthermore, the parameters shown in FIG. 7 can be found by, for example, a die sort test or simulation and stored in the ROM fuse 40 before product shipping.

In the case of FIG. 7, the first reset step is, for example, a write sequence as shown in FIG. 8. In other words, in the cycle <1>, pages <1> to <4> in the bay <1> and pages <9> to <12> in the bay <2> are selected. In the cycle <2>, pages <5> to <8> in the bay <1> and pages <13> to <16> in the bay <2> are selected. In this case, the number of selected bits per cycle is 8 bits/cycle.

On the other hand, the second reset step is, for example, a write sequence as shown in FIG. 9. In other words, in the cycle <1>, pages <1> to <4> in the bay <1> are selected.

In the cycle <2>, pages <5> to <8> in the bay <1> are selected. Subsequently, in the cycle <3>, pages <9> to <12> in the bay <2> are selected. In the cycle <4>, pages <13> to <16> in the bay <2> are selected. In this case, the number of selected bits per cycle is 4 bits/cycle.

Figures 10, 11:
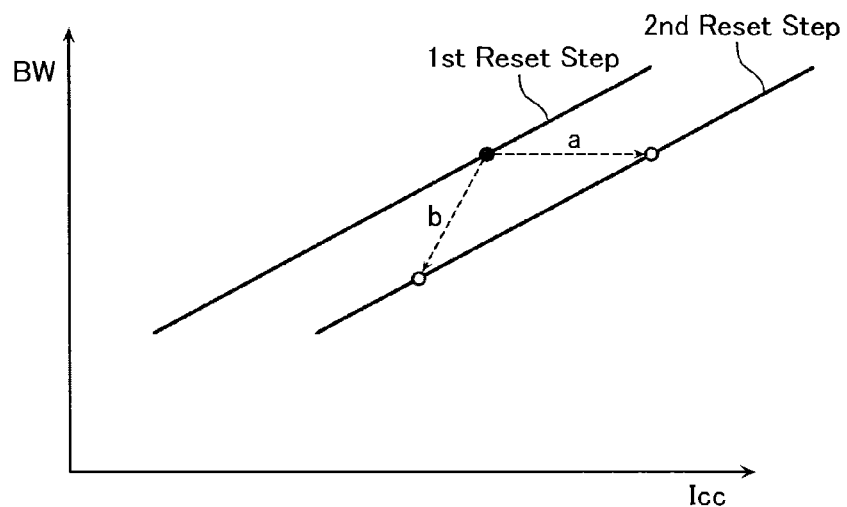
FIG. 10 is an example of a diagram showing read data of respective pages after the first reset step in the write sequence in the nonvolatile semiconductor memory device according to the first embodiment.
FIG. 11 is an example of a diagram showing changes in current consumption and a bandwidth at the time of the reset step in the write sequence in the nonvolatile semiconductor memory device according to the first embodiment.

A case will be considered that write data and read data from the pages <1> to <16> after the first reset step is as shown in FIG. 10. Comparing the write data with the read data in this case, it is found that the memory cell MC on the page <14> is an error bit (underlines in FIG. 10). In other words, this case corresponds to the case where there is an error bit at the verify step S162. Thereafter, at the second reset step, a reset pulse is applied only to the memory cell MC on the page <14> (underlines in FIG. 10).

Effects of the present embodiment will now be described.

FIG. 11 is an example of a diagram showing changes in current consumption and a bandwidth at the time of the reset step in the write sequence in the nonvolatile semiconductor memory device according to the present embodiment. FIG. 12 is an example of a diagram showing relations between the current consumption (Icc) and the bandwidth (BW) over the whole time of the reset step. A comparative example fixed in the number of simultaneously selected bits/bays is also shown in FIGS. 11 and 12.

Here, for an example, a case is considered that it is desired to make the bandwidth over the whole time of the reset step BW equal to or larger than T1 and to make current consumption Icc equal to or smaller than A1 (a shaded range in FIG. 12). At the second reset step, a reset pulse is applied to a memory cell MC that has not become a high resistance state at the time of the first reset step. At the second reset step, therefore, a reset pulse that is higher in height or wider in width as compared with that at the time of the first reset step is applied in some cases. As a result, the current consumption becomes large, and current characteristics at the second reset step move to a rightward direction (a direction in which Icc increases) as compared with current characteristics at the first reset step as shown in FIG. 11.

In the case of the comparative example, the number of simultaneously selected bays at the time of the second reset step is the same as that at the time of the first reset step, and consequently, as shown in FIG. 11, current consumption at the time of the second reset step increases (a dashed line arrow "a" in FIG. 11). As shown in FIG. 12, therefore, the bandwidth BW over the whole time of the reset step can be made larger than T1. However, the current consumption becomes larger than A1 (a black circle "a" in FIG. 12).

On the other hand, in the case of the present embodiment, the number of simultaneously selected bays at the time of the second reset step is made smaller than that at the time of the first reset step. As shown in FIG. 11, therefore, the current consumption Icc at the time of the second reset step can be reduced (a dashed line arrow "b" in FIG. 11). As a result, it is possible, as shown in FIG. 12, to make the bandwidth over the whole time of the reset step BW equal to or larger than T1 and make current consumption Icc equal to or smaller than A1 (a white circle "b" in FIG. 12).

According to the present embodiment, it is possible to suppress the current consumption Icc over the whole time of the reset sequence while securing a bandwidth BW by decreasing the number of simultaneously selected bays at the time of the first reset step and the second reset step.

Second Embodiment

In a second embodiment, a case where the number of simultaneously selected bits is increased at the time of a set step will be described.

FIG. 13 is an example of a diagram showing the number of simultaneously selected bits/bays at the time of the set step in a write sequence in a nonvolatile semiconductor memory device according to the second embodiment.

In the example shown in FIG. 13, the number of simultaneously selected bits is set equal to 1 and the number of simultaneously selected bays is set equal to 2 at a first reset step, and the number of simultaneously selected bits is set equal to 4 and the number of simultaneously selected bays is set equal to 2 at a second reset step. In other words, the number of simultaneously selected bits at the second reset step is made larger than that at the first reset step. By the way, these four parameters should be stored in a ROM fuse 40 so that a logic circuit 30 is configured to refer to the parameters at the time of the set step (the step S151 in FIG. 6). Furthermore, the parameters shown in FIG. 13 can be found by, for example, a die sort test or simulation and stored in the ROM fuse 40 before product shipping.

In the case of FIG. 13, the first set step is, for example, a write sequence as shown in FIG. 14. In other words, in the cycle <1>, page <1> in the bay <1> and page <9> in the bay <2> are selected. In the cycle <2>, page <2> in the bay <1> and pages <10> in the bay <2> are selected. In the same way, in the cycle <3> to the cycle <8>, one page is selected from each of the bays <1> and <2>. In this case, the number of selected bits per cycle is 2 bits/cycle.

Figures 15, 16:
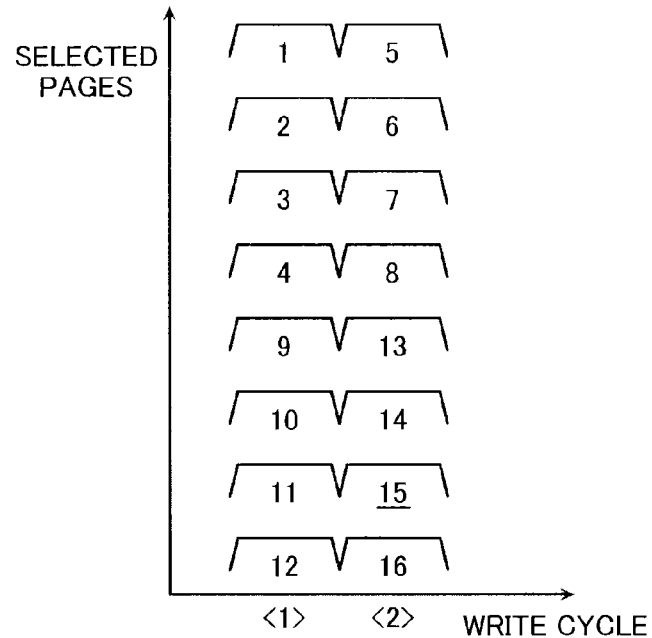
FIG. 15 is an example of a diagram showing relations between a write cycle and selected pages at the time of a second step in the write sequence in the nonvolatile semiconductor memory device according to the second embodiment.
FIG. 16 is an example of a diagram showing read data of respective pages after the first set step in the write sequence in the nonvolatile semiconductor memory device according to the second embodiment.

On the other hand, the second set step is, for example, a write sequence as shown in FIG. 15. In other words, in the cycle <1>, pages <1> to <4> in the bay <1> and pages <9> to <12> in the bay <2> are selected. In the cycle <2>, pages <5> to <8> in the bay <1> and pages <13> to <16> in the bay <2> are selected. In this case, the number of selected bits per cycle is 8 bits/cycle.

For example, a case will be considered that write data and read data from the pages <1> to <16> after the first set step are as shown in FIG. 16. Comparing the write data with the read data in this case, it is found that the memory cell MC on the page <15> is an error bit (underlines in FIG. 16). In other words, this case corresponds to the case where there is an error bit at the verify step S162. Thereafter, at the second set step, a set pulse is applied only to the memory cell MC on the page <15> (underlines in FIG. 16).

Effects of the present embodiment will now be described.

Figure 17:
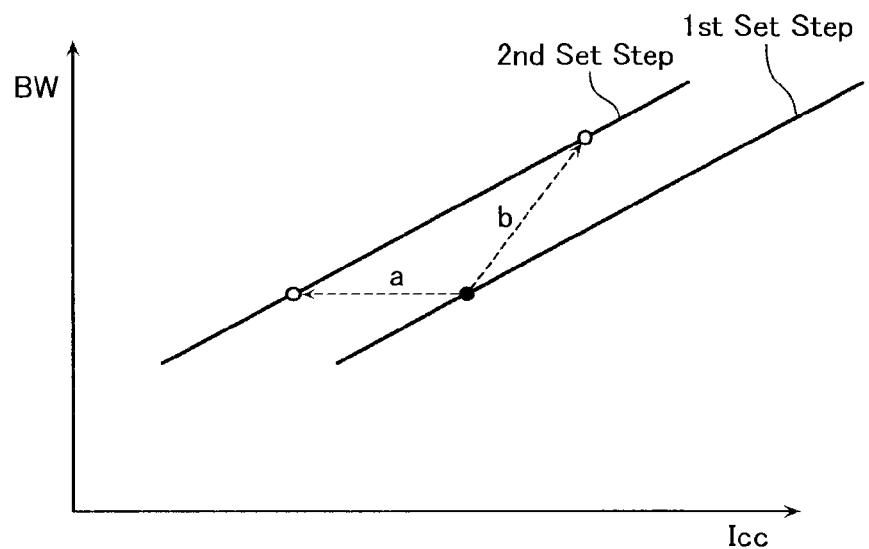
FIG. 17 is an example of a diagram showing changes in current consumption and a bandwidth at the time of the set step in the write sequence in the nonvolatile semiconductor memory device according to the second embodiment.
Figure 18:
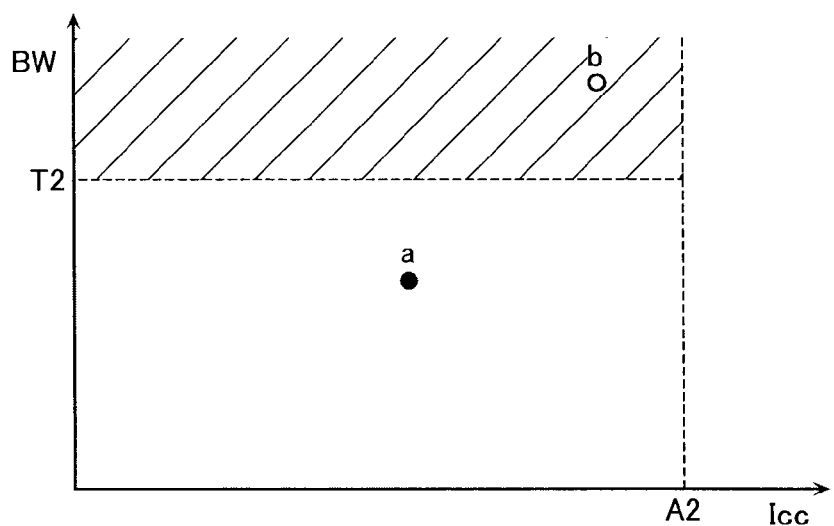
FIG. 18 is an example of a diagram showing relations between the current consumption and the bandwidth over the whole time of the set step in the write sequence in the nonvolatile semiconductor memory device according to the second embodiment.

FIG. 17 is an example of a diagram showing changes in the current consumption and the bandwidth at the time of the set step in the write sequence in the nonvolatile semiconductor memory device according to the present embodiment. FIG. 18 is an example of a diagram showing relations between the current consumption (Icc) and the bandwidth (BW) over the whole time of the set step. A comparative example fixed in the number of simultaneously selected bits/bays is also shown in FIGS. 17 and 18.

Here, a case, for example, will be considered where it is desired to make the bandwidth over the whole time of the set step BW equal to or larger than T2 and make current consumption Icc equal to or smaller than A2 (a shaded range in FIG. 18). At the second set step, a set pulse is not applied to a memory cell MC that has become a low resistance state at the time of the first set step. At the second set step, therefore, a reset pulse that is higher in height or wider in width as compared with that at the time of the first reset step is applied in some cases. At the second step, therefore, current consumption becomes smaller than that at the time of the first set step in some cases. As shown in FIG. 17, therefore, current characteristics at the second set step move to a leftward direction (a direction in which Icc decreases) as compared with current characteristics at the first set step.

In the case of the comparative example, current consumption at the time of the second set step decreases as compared with that at the time of the first step as shown in FIG. 17. However, the bandwidth BW at the time of the second step becomes the same as that at the time of the first step (a dashed line arrow "a" in FIG. 17). As shown in FIG. 18, therefore, current consumption over the whole time of the set step can be made smaller than A2. However, the bandwidth BW becomes smaller than T2 (a black circle "a" in FIG. 18).

On the other hand, in the case of the present embodiment, the number of simultaneously selected bits at the time of the second set step is made smaller than that at the time of the first set step. As shown in FIG. 17, therefore, the bandwidth BW at the time of the second set step can be increased (a dashed line arrow "b" in FIG. 17). As a result, it is possible, as shown in FIG. 18, to make the bandwidth over the whole time of the set step BW equal to or larger than T2 and to make current consumption Icc equal to or smaller than A2 (a white circle "b" in FIG. 18).

According to the present embodiment, it is possible to increase the bandwidth BW over the whole time of the set step in a possible range of the current consumption Icc by decreasing the number of simultaneously selected bits at the first step and the second set step.

Third Embodiment

In a third embodiment, a method for setting the number of simultaneously selected bays and the number of simultaneously selected bits, taking account of the number of errors in memory cells MC after a first write step, will be described. Although the method will be described by taking a set step as an example, the present embodiment can also be applied to a reset step as well in the same way.

Even if the number of selected bits per cycle is the same, a bandwidth BW and a current consumption Icc become different depending upon a combination of the number of simultaneously selected bits and the number of simultaneously selected bays.

Figure 19:
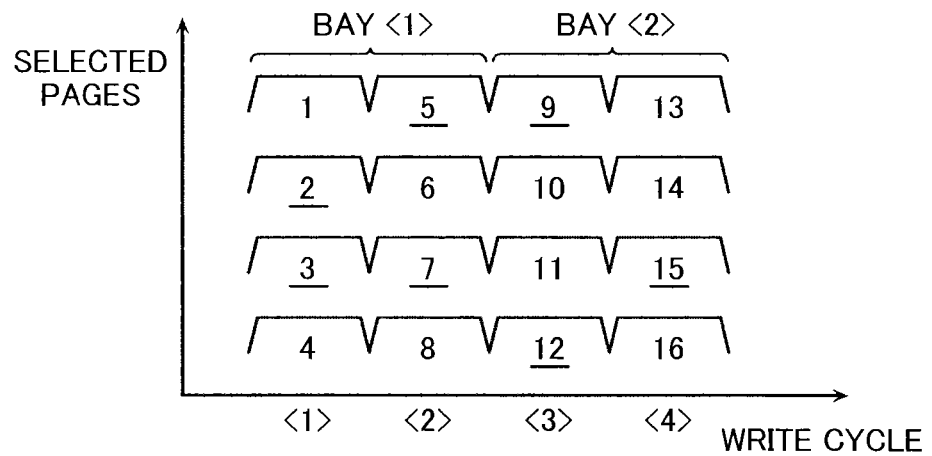
FIG. 19 is an example of a diagram showing relations between write cycles and selected pages at the time of a first set step in the write sequence in the nonvolatile semiconductor memory device according to a third embodiment.
Figure 20:
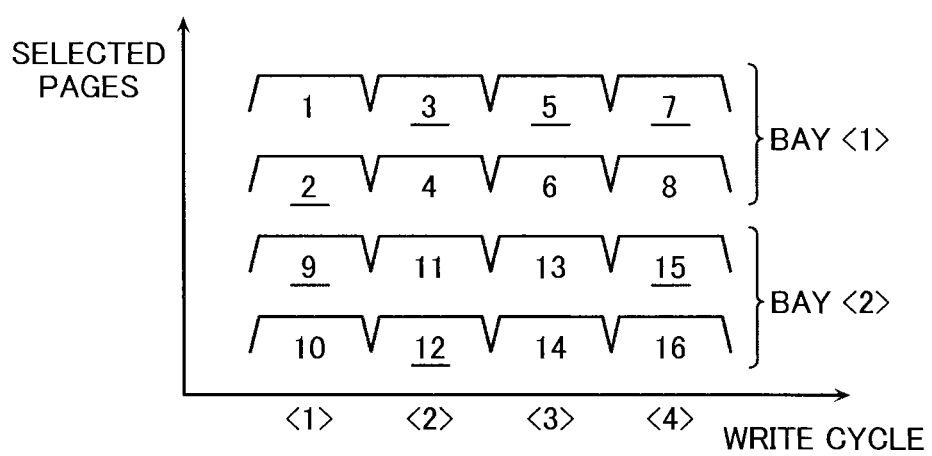
FIG. 20 is an example of a diagram showing relations between write cycles and selected pages at the time of a second step in the write sequence in the nonvolatile semiconductor memory device according to the third embodiment.

An example of relations between write cycles and selected pages at the first set step and a second set step in a write sequence of a nonvolatile semiconductor memory device according to the present embodiment are shown in FIG. 19 and FIG. 20, respectively.

FIG. 19 is a diagram of the first set step, and shows a case where the number of simultaneously selected bits per bay is large and the number of simultaneously selected bays is small. In other words, the number of selected bits per cycle is four. Since the number of simultaneously selected bays is one, however, four bits are selected per bay. In the case of the example shown in FIG. 19, pages <1> to <4> in bay <1> are selected in cycle <1>. In cycle <2>, pages <5> to <8> in bay <1> are selected. Subsequently, in cycle <3>, pages <9> to <12> in bay <2> are selected. In cycle <4>, pages <13> to <16> in bay <2> are selected.

FIG. 20 is a diagram of the second set step, and shows a case where the number of simultaneously selected bits per bay is small and the number of simultaneously selected bays is large. In other words, the number of selected bits per cycle is two. Since the number of simultaneously selected bays is two, however, two bits are selected per bay. In the case of the example shown in FIG. 20, pages <1> and <2> in bay <1> and pages <9> and <10> in bay <2> are selected in cycle <1>. In cycle <2>, pages <3> and <4> in bay <1> and pages <11> and <12> in bay <2> are selected. Subsequently, in cycle <3>, pages <5> and <6> in bay <1> and pages <13> and <14> in bay <2> are selected. In cycle <4>, pages <7> and <8> in bay <1> and pages <15> and <16> in bay <2> are selected.

In a case where, at the time of the second set step, the number of simultaneously selected bits per bay is made smaller and the number of simultaneously selected bays is made larger as compared with those at the time of the first set step, the bandwidth BW and the current consumption Icc become as described below. Note that the number of selected bits per cycle is the same as that in the comparative example.

Figure 21:
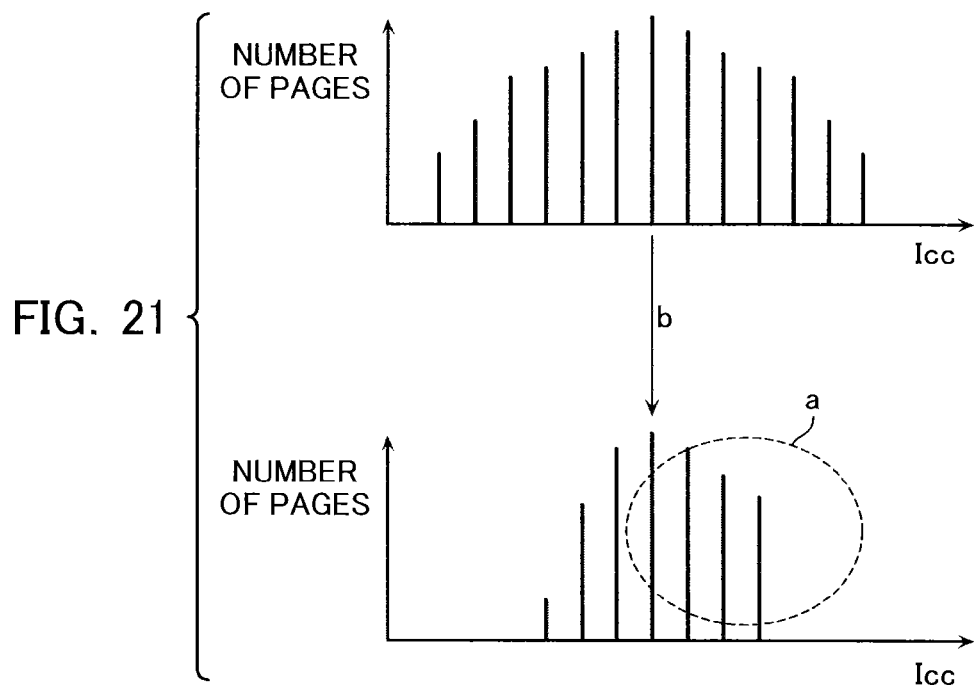
FIG. 21 is an example of a distribution diagram of the number of pages as a function of current consumption at the time of a set step in the write sequence in the nonvolatile semiconductor memory device according to the third embodiment.
Figure 22:
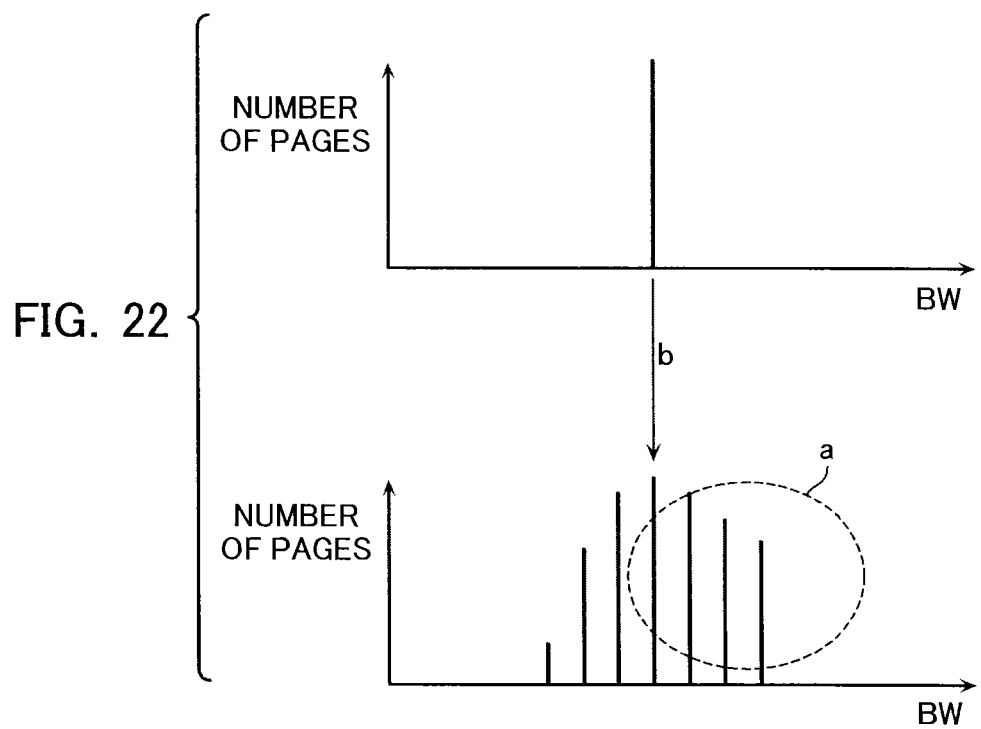
FIG. 22 is an example of a distribution diagram of the number of pages as a function of the bandwidth at the time of a set step in the write sequence in the nonvolatile semiconductor memory device according to the third embodiment.

FIGS. 21 and 22 show an example of a distribution diagram concerning the number of pages at the time of a set step in the write sequence in the nonvolatile semiconductor memory device according to the present embodiment. FIG. 21 is an example of a distribution diagram of the number of pages as a function of the current consumption Icc. FIG. 22 is an example of a distribution diagram of the number of pages as a function of the bandwidth BW. A comparative example fixed in the number of simultaneously selected bits/bays is also shown in FIGS. 21 and 22.

In the case of the comparative example, the number of pages as a function of the current consumption Icc exhibits nearly normal distribution as shown in upper parts of FIG. 21 and the number of pages as a function of the bandwidth BW becomes constant as shown in upper parts of FIG. 22.

On the other hand, the case will be considered that, at the time of the second set step, the number of simultaneously selected bits per bay is made smaller and the number of simultaneously selected bays is made larger as compared with those at the time of the first set step. In this case, the current consumption Icc becomes large as indicated by a dashed line circle "a" in FIG. 21. As indicated by a dashed line circle "a" in FIG. 22, however, the bandwidth BW can be increased. Note that median values of the number of pages as a function of the current consumption Icc and the number of pages as a function of the bandwidth BW are the same as those in the comparative example (arrows "b" in FIGS. 21 and 22).

On the contrary, in a case where at the time of the second set step, the number of simultaneously selected bits per bay is made larger and the number of simultaneously selected bays is made smaller as compared with those at the time of the first set step, the bandwidth BW and the current consumption Icc become as described below. Note that the number of selected bits per cycle is the same as that in the comparative example.

Figure 23:
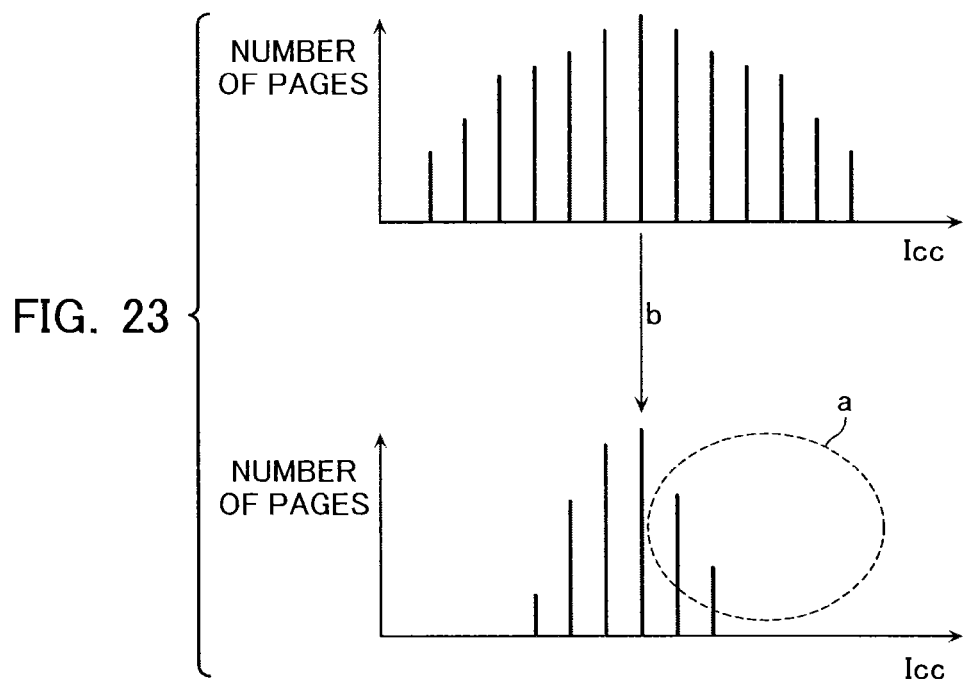
FIG. 23 is an example of a distribution diagram of the number of pages as a function of current consumption at the time of a set step in the write sequence in the nonvolatile semiconductor memory device according to the third embodiment.
Figure 24:
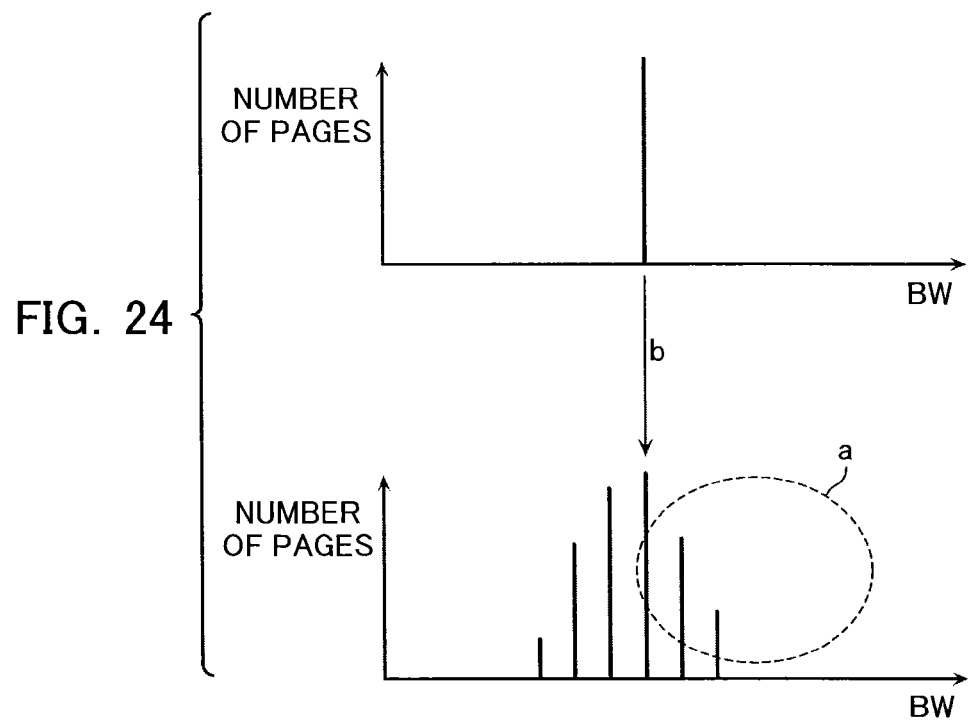
FIG. 24 is an example of a distribution diagram of the number of pages as a function of the bandwidth at the time of a set step in the write sequence in the nonvolatile semiconductor memory device according to the third embodiment.

FIGS. 23 and 24 show an example of a distribution diagram concerning the number of pages at the time of the set step in the write sequence in the nonvolatile semiconductor memory device according to the present embodiment. FIG. 23 is an example of a distribution diagram of the number of pages as a function of the current consumption Icc. FIG. 24 is an example of a distribution diagram of the number of pages as a function of the bandwidth BW. The same comparative example as that in FIGS. 21 and 22 is also shown in FIGS. 23 and 24.

A case will be considered that, at the time of the second set step, the number of simultaneously selected bits is made larger and the number of simultaneously selected bays is made smaller as compared with those at the time of the first set step. In this case, the bandwidth BW decreases as indicated by a dashed line circle "a" in FIG. 24. As indicated by a dashed line circle "a" in FIG. 23, however, the current consumption Icc can be made smaller.

Based on the description using FIGS. 21 to 24, set steps according to the present embodiment will now be described with reference to FIGS. 19 and 20.

FIGS. 19 and 20 are diagrams showing relations between write cycles and selected pages at the time of the first set step and the second set step in the write sequence in the nonvolatile semiconductor memory device according to the present embodiment.

Figures 25, 26:
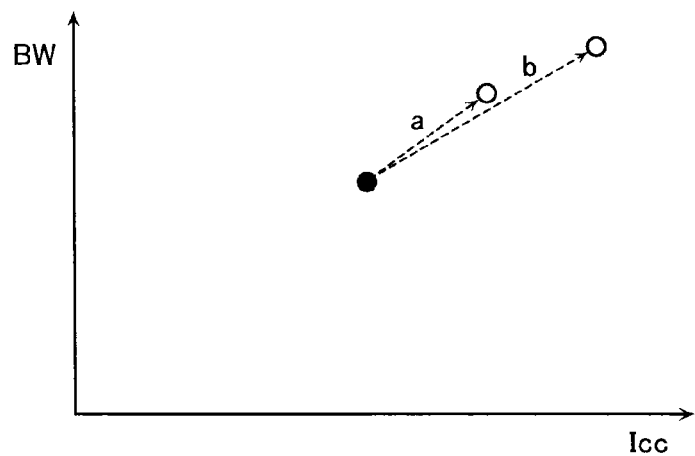
FIG. 25 is an example of a diagram showing read data of respective pages after the first set step in the write sequence in the nonvolatile semiconductor memory device according to the third embodiment.
FIG. 26 is an example of a diagram showing changes in current consumption and a bandwidth at the time of the set step in the write sequence in the nonvolatile semiconductor memory device according to the third embodiment.

A case will be considered that write data and read data from the pages <1> to <16> after the first set step are as shown in FIG. 25. Comparing the write data with the read data in this case, it is found that seven memory cells MC, for example, on the pages <2> and <3> are error bits (underlines in FIG. 25). In other words, this case corresponds to the case where there is an error bit at the verify step S162. Thereafter, at the second set step, a set pulse is applied only to the seven memory cells MC on the pages <2>, <3> and so on (underlines in FIGS. 19 and 20).

Effects of the present embodiment will now be described.

Figure 27:
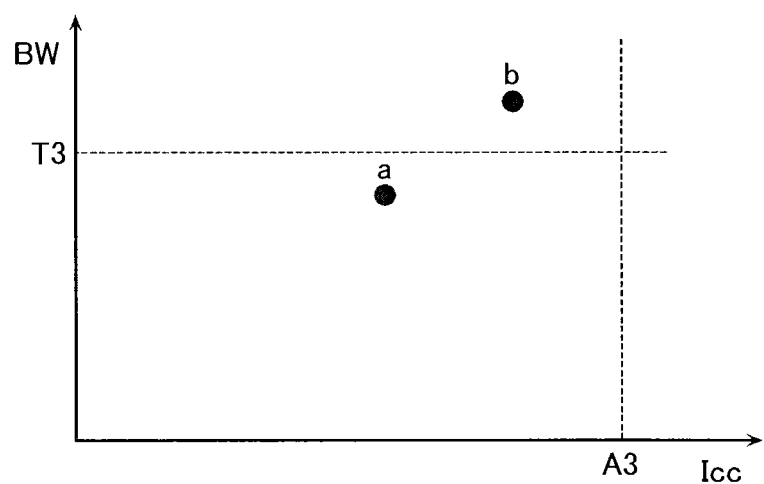
FIG. 27 is an example of a diagram showing relations between the current consumption and the bandwidth over the whole time of the set step in the write sequence in the nonvolatile semiconductor memory device according to the third embodiment.

FIG. 26 is an example of a diagram showing changes in the current consumption and the bandwidth at the time of the set step in the write sequence in the nonvolatile semiconductor memory device according to the present embodiment. FIG. 27 is a diagram showing relations between the current consumption (Icc) and the bandwidth (BW) over the whole time of the set step.

In a case where the number of simultaneously selected bits per bay is made larger and the number of simultaneously selected bays is made smaller, the current in the peripheral circuit flowing per selected bay is the same and, consequently, the current consumption Icc is reduced by an amount corresponding to the reduced number of selected bays. On the other hand, a time for changing over the selected bay between the cycle <2> and the cycle <3>, and consequently the write time is longer by the time. In other words, the write time is longer so that the increased bandwidth BW. As compared with the case where the number of simultaneously selected bits per bay is made smaller and the number of simultaneously selected bays is made larger, therefore, the bandwidth BW appears to reduce. However, the current consumption Icc can be made smaller (a dashed line arrow "a" in FIG. 26). As a result, current consumption Icc over the whole time of the set step can also be suppressed (a black circle "a" in FIG. 27).

On the other hand, in a case where the number of simultaneously selected bits per bay is made small and the number of simultaneously selected bays is made large, the bays <1> and <2> are always selected and the changeover time for selected bay does not occur. On the other hand, since the number of selected bays is large, the current consumption Icc becomes large. As compared with the case where the number of simultaneously selected bits is made larger and the number of simultaneously selected bays is made smaller, therefore, the current consumption Icc becomes large, but the bandwidth BW can be seen to have increased (an arrow "b" in FIG. 26). As a result, the bandwidth (BW) over the whole time of the set step can be made large (a black circle "b" in FIG. 27).

In a case where it is desired to cause the current consumption over the whole time of the set sequence to satisfy the relation, for example, Icc≤A3, the number of simultaneously selected bits per bay is made larger and the number of simultaneously selected bays is made smaller, as shown in FIG. 19, according to the foregoing description. On the other hand, in a case where it is desired to cause the bandwidth (BW) to satisfy, for example, the relation BW≥T3 although the restriction on the current consumption Icc over the whole time of the set step is loose, the number of simultaneously selected bits per bay is made smaller and the number of simultaneously selected bays is made larger as shown in FIG. 20.

In other words, even in the case where the same number of write bits per cycle is secured, the current consumption Icc can be further suppressed by making the number of simultaneously selected bays smaller and the operation speed can be made faster by making the number of simultaneously selected bits per bay smaller.

In the present embodiment, therefore, it is determined which of the number of simultaneously selected bits per bay and the number of simultaneously selected bays is made large depending upon the data writing situation of each page at the time of the first set step, and the second set step is executed.

If a memory cell MC is an error bit, a set pulse is applied to the memory cell MC at the next set step. At that time, as for other memory cells MC included in a bay including the error bit, a bit line BL is not selected to prevent the resistance state from making a transition. In other words, as the number of error bits becomes large, bits selected at the second set step increase and consequently the current in the peripheral circuit proportionate to the number of selected bits increases. As a result, the current consumption Icc becomes large.

In a case where the number of error bits is large, therefore, the current consumption Icc can be suppressed by making the number of simultaneously selected bays smaller as shown in FIG. 19. On the other hand, in a case where the number of error bits is relatively small, the bandwidth BW can be increased within the limit of the current consumption Icc by making the number of simultaneously selected bays large as shown in FIG. 20.

Figure 28:
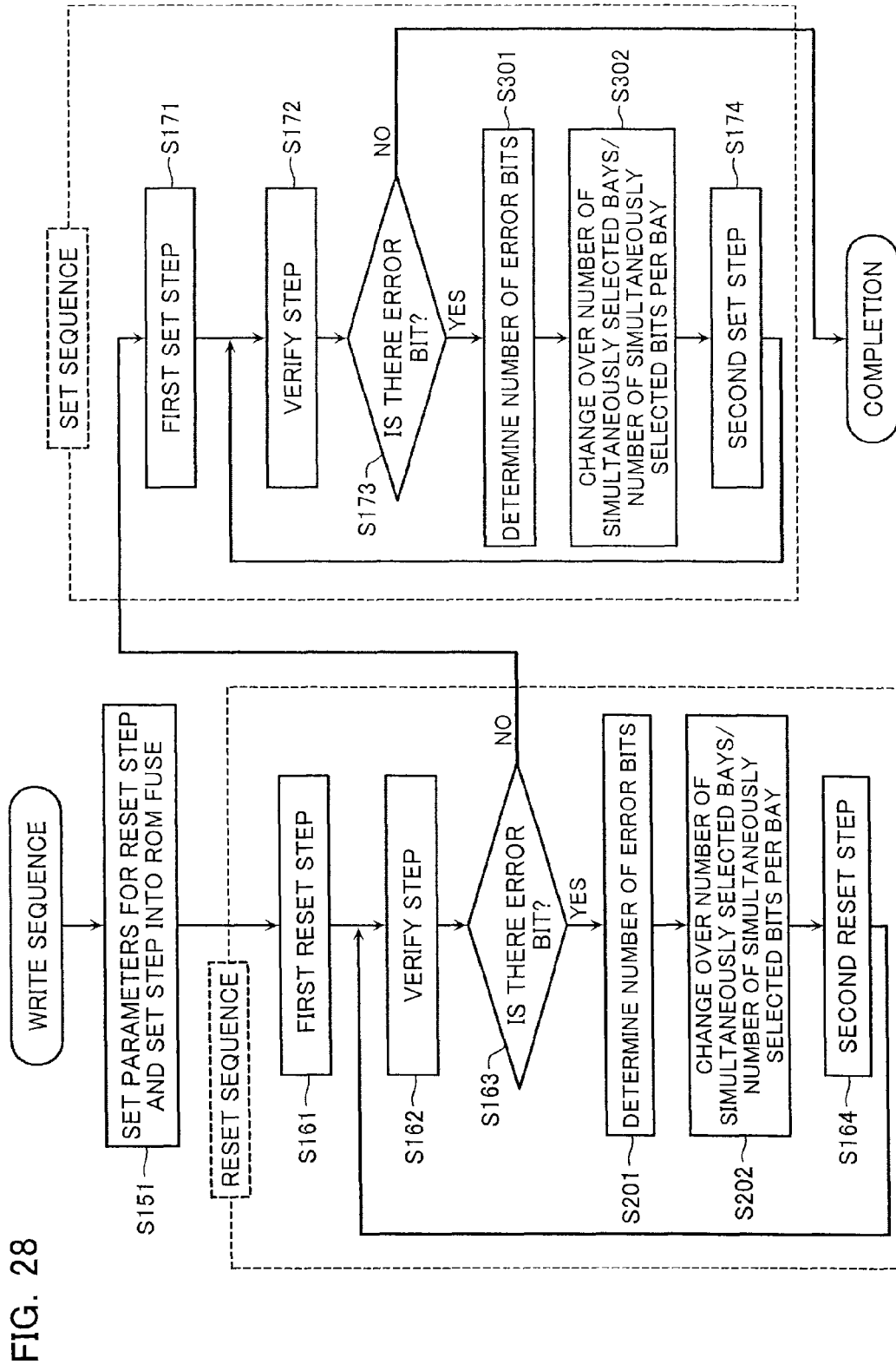
FIG. 28 is an example of a flow chart of a write sequence in the nonvolatile semiconductor memory device according to the third embodiment.

An example of a flow chart of the write sequence in the nonvolatile semiconductor memory device according to the present embodiment is shown in FIG. 28. The same steps as those in the first embodiment are denoted by like reference characters, and description of them will not be repeated. The control unit determines the number of error bits at steps S201 and S301. The control unit changes over the combination of the numbers of simultaneously selected bits/bays at the time of the second set step depending upon the number of error bits at steps S202 and S302.

By the way, parameters of the number of simultaneously selected bits/bays to be used in three cases (i.e. at the time of the first step, the case where the number of error bits at the time of the second step is large, and the case where the number of error bits at the time of the second step is small) may be stored in the ROM fuse 40 such that the logic circuit 30 configured to selectively refer to the parameters depending upon whether the number of error bits is large or small (step S151 in FIG. 28).

According to the present embodiment, the bandwidth BW and the current consumption Icc over the whole time of the set sequence can be adjusted to optimum values by changing over the combination of the number of simultaneously selected bits/bays at the time of the second set step depending upon the number of error bits.

Fourth Embodiment

In a fourth embodiment, a nonvolatile semiconductor memory device including a memory cell array having a structure in which bit lines BL are disposed vertically will be described. In the following, this structure is referred to as "3D structure."

Figure 29:
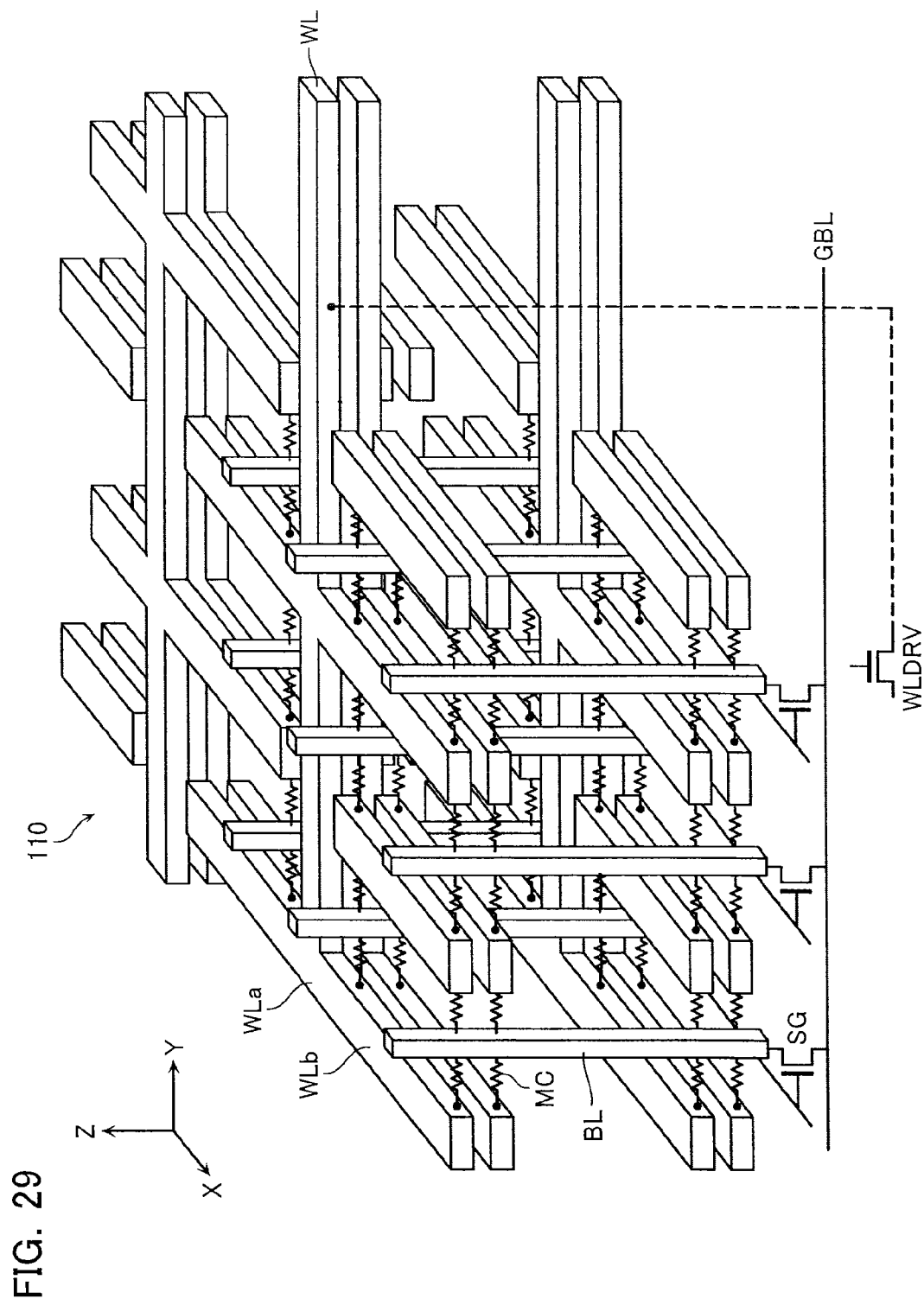
FIG. 29 is an example of an oblique view showing a part of a memory cell array in a nonvolatile semiconductor memory device according to a fourth embodiment.

FIG. 29 is an example of an oblique view showing a part of a memory cell array in the nonvolatile semiconductor memory device according to the present embodiment. In FIG. 29, an X direction, a Y direction, and a Z direction are also shown as three directions which are orthogonal to each other.

A memory cell array 110 includes bit lines BL (first interconnections) extending in a lamination direction (Z direction) of the nonvolatile semiconductor memory device which intersects the Y direction and the X direction. The bit lines BL are disposed in a matrix form in the Y direction and the X direction. Furthermore, the memory cell array 110 includes word lines WL (second interconnections) formed to take a shape of teeth of a comb extending to both sides. Handle parts of the word lines WLa extend in the Y direction. Comb teeth parts WLb of the word lines WL extend in the X direction. The word lines WL are disposed to be arranged in parallel in the Z direction. The plurality of comb teeth parts WLb of each word line WL are disposed in every other interval between adjacent bit lines 13L in the Y direction. As a result, adjacent word lines WL in the X direction disposed in the same position in the Z direction can be disposed to have opposing comb teeth parts between bit lines BL alternately. Furthermore, in the memory cell array 110, a memory cell MC including a variable resistance element is formed in each of intersection parts of the plurality bit lines BL and the plurality of comb teeth parts WLb included in the word lines WL.

Furthermore, the memory cell array 110 includes a plurality of global bit lines GBL extending in the Y direction. The global bit lines GBL are disposed between a semiconductor substrate (not illustrated) and disposition areas of the memory cells MC. Each global bit line GBL is electrically connected to end parts of the bit lines BL arranged in the Y direction via selection gates SG. Selection gates SG arranged in the X direction are controlled by a common signal. Furthermore, the memory cell array includes word line drivers WLDRV which drive the word lines WL. The word line drivers WLDRV are disposed on the semiconductor substrate.

Figure 30:
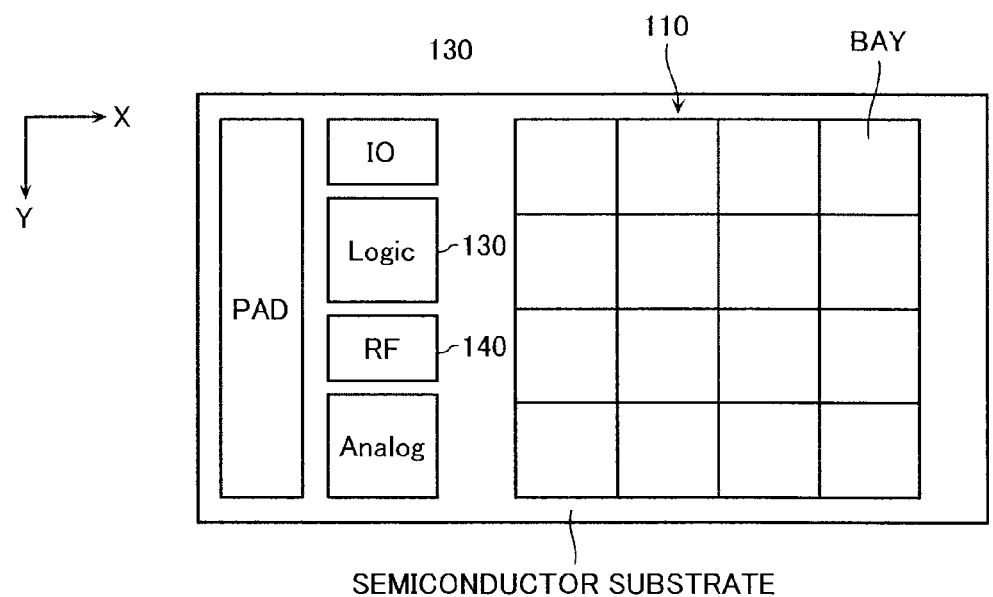
FIG. 30 is a diagram showing an example of a plane layout of the nonvolatile semiconductor memory device according to the fourth embodiment.

FIG. 30 is an example of a diagram showing a plane layout of the nonvolatile semiconductor memory device according to the present embodiment.

In the case of this layout, the memory cell array 110 is disposed on a right part on the semiconductor substrate shown in FIG. 30, and a left part on the semiconductor substrate is a disposition area of a peripheral circuit. The memory cell array 110 is divided into, for example, sixteen bays. The sixteen bays are disposed in a four by four arrangement in the X direction and the Y direction. A disposition area (illustrated PAD) of a pad extending in the longitudinal direction is disposed on a left end of the disposition area of the peripheral circuit. And inside the disposition area of the pad, a disposition area (illustrated "IO") of an input/output interface, a disposition area (illustrated "Logic") of a logic circuit 130, a disposition area (illustrated "RF") of a ROM fuse 140, and a disposition area (illustrated "Analog") of an analog circuit are arranged. Parameters to be used in a reset sequence and a set sequence are stored in the ROM fuse 140 in the same way as the first to third embodiments.

Figure 31:
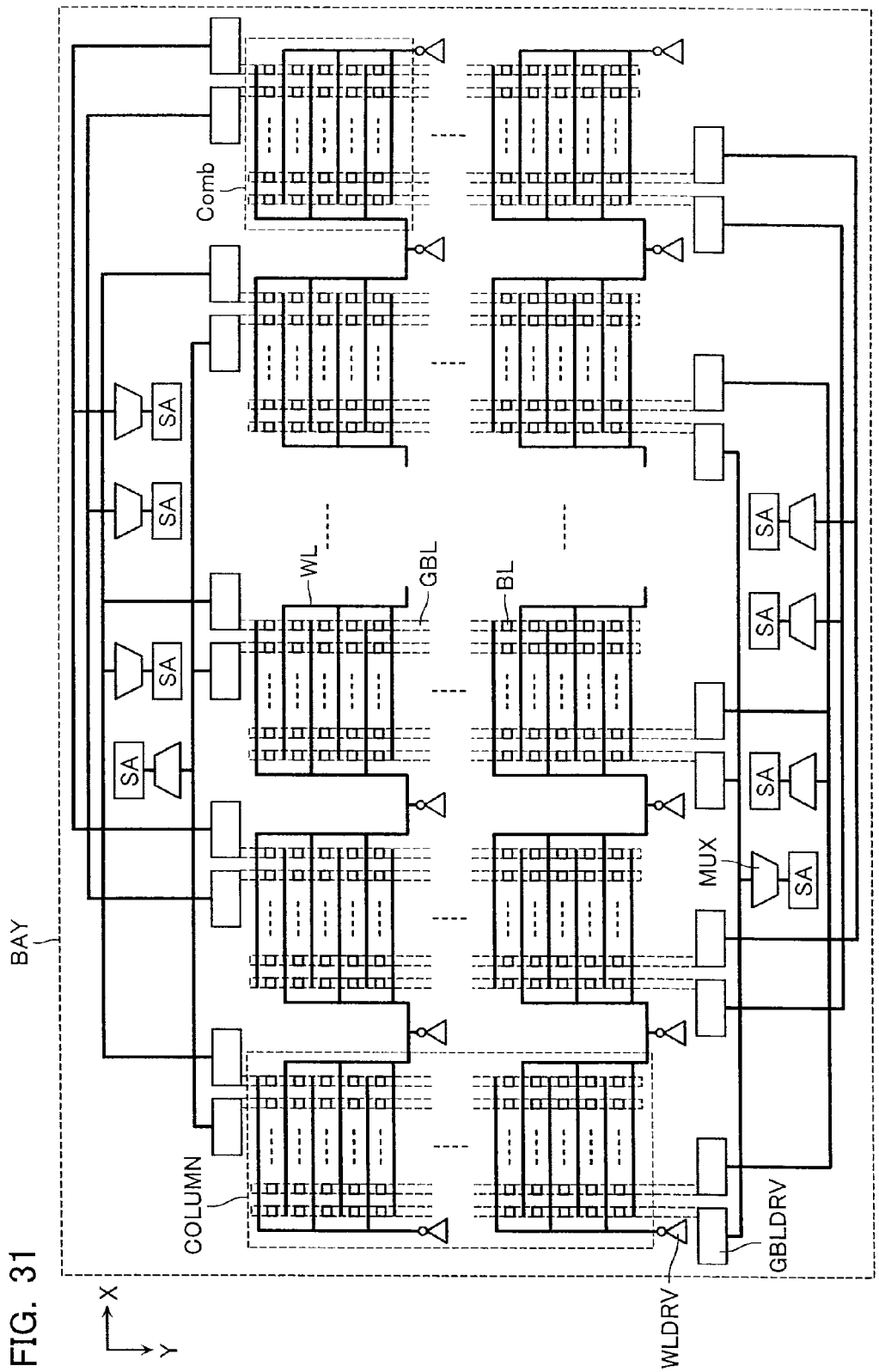
FIG. 31 is an example of a configuration diagram of a bay and its peripheral circuit in the memory cell array in the nonvolatile semiconductor memory device according to the fourth embodiment.

FIG. 31 is an example of a configuration diagram of a bay and its peripheral circuit in the memory cell array in the nonvolatile semiconductor memory device according to the present embodiment. FIG. 31 is an example of a function block diagram corresponding to one bay.

In FIG. 31, the word line drivers WLDRV, global bit line drivers GBLDRV, sense amplifiers SA, and multiplexers MUX are shown as the peripheral circuit.

The word line driver WLDRV is a circuit which drives a word line WL. One word line driver WLDRV is provided for each word line WL. The global bit line driver GBLDRV is a circuit which drives a global bit line GBL. One global bit line driver GBLDRV is provided on an end part of each global bit line GBL in the Y direction. The sense amplifier SA is a circuit which detects and amplifies a cell current flowing through the global bit line GBL. One sense amplifier SA is provided for a predetermined number of global bit lines GBL via a multiplexer MUX. Only one global bit line GBL is selected out of the predetermined number of global bit lines GBL by the multiplexer MUX and connected electrically to the sense amplifier SA.

By the way, in the case of the memory cell array 110 having a 3D structure, a collection of groups each having a plurality of memory cells connected in common to comb teeth parts WLb located on one side of a word line WL, obtained by collecting an amount corresponding to word lines WL laminated on the same position in the Z direction constitutes one comb. Furthermore, combs arranged in the Y direction constitute one column. And a plurality of columns arranged in the Z direction constitutes one bay.

Effects obtained in the case where the memory cell array 110 having the structure shown in FIG. 29 is used and the number of simultaneously selected bits and the number of simultaneously selected bays are changed over between the first reset/set step and the second reset/set step will now be described.

As an example, effects obtained in the case where the number of simultaneously selected bays at the time of the second reset/set step is made smaller than that at the time of the first reset/set step will be described with reference to FIGS. 32 and 33. Note that, in this example, the number of simultaneously selected bits is not changed over.

Figure 32:
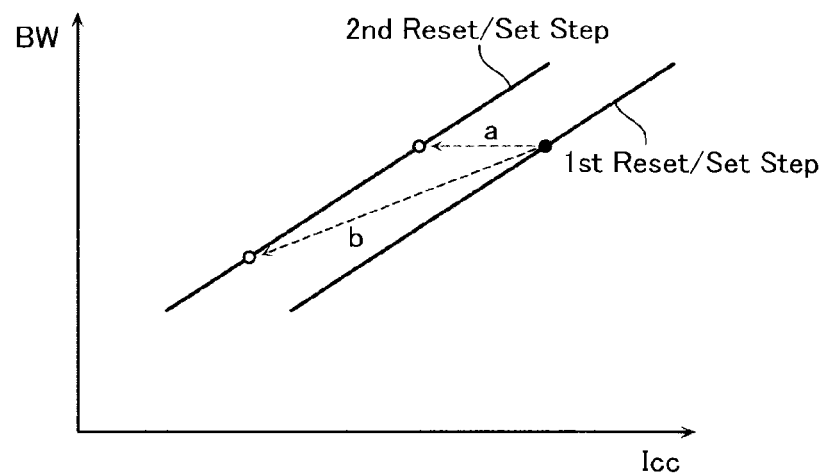
FIG. 32 is an example of a diagram showing changes in current consumption and a bandwidth at the time of a reset/set step in a write sequence in the nonvolatile semiconductor memory device according to the fourth embodiment.

FIG. 32 is an example of a diagram showing changes in current consumption and the bandwidth at the time of the reset/set step in the write sequence in the nonvolatile semiconductor memory device according to the present embodiment. FIG. 33 is an example of a diagram showing relations between the current consumption and the bandwidth over the whole time of the reset/set step. A comparative example fixed in the number of simultaneously selected bits/bays is also shown in FIGS. 32 and 33.

Figure 33:
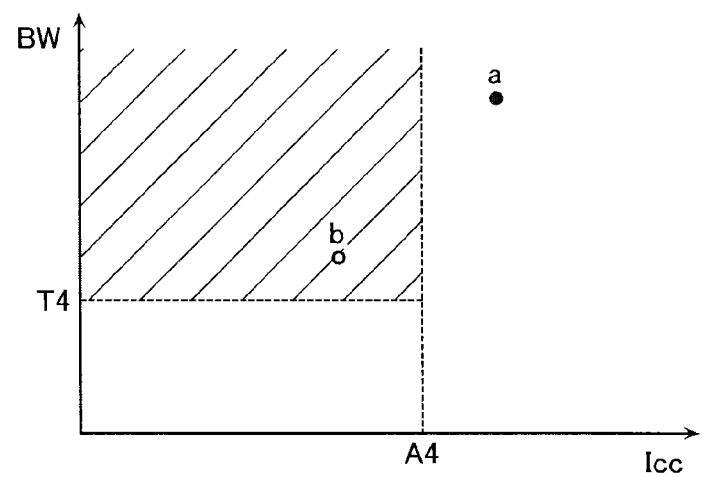
FIG. 33 is an example of a diagram showing relations between the current consumption and the bandwidth over the whole time of the reset/set step in the write sequence in the nonvolatile semiconductor memory device according to the fourth embodiment.

Here, a case, for example, will be considered that it is desired to make the bandwidth over the whole time of the reset/set step BW equal to or larger than T4 and to make current consumption Icc equal to or smaller than A4 (a shaded range in FIG. 33). At the second reset step, a reset pulse is not applied to a memory cell MC that has become a high resistance state at the time of the first reset step. At the second reset step, therefore, the current consumption is smaller than that at the time of the first set step in some cases. As shown in FIG. 32, therefore, current characteristics at the second reset step move to a leftward direction (a direction in which Icc decreases) as compared with current characteristics at the first reset step.

In the case of the comparative example, the number of simultaneously selected bays at the time of the second reset/set step is the same as that at the time of the first reset/set step, and consequently, as shown in FIG. 32, current consumption at the time of the second reset/set step cannot be made sufficiently small (a dashed line arrow "a" in FIG. 32). As shown in FIG. 33, therefore, current consumption Icc over the whole time of the reset/set step becomes larger than A4 (a black circle "a" in FIG. 33).

On the other hand, in the case of the present embodiment, the number of simultaneously selected bays at the time of the second reset/set step is made smaller than that at the time of the first reset/set step. As shown in FIG. 32, therefore, the current consumption Icc at the time of the second reset/set step can be reduced sufficiently (a dashed line arrow "b" in FIG. 32). As a result, it is possible as shown in FIG. 33 to make the bandwidth over the whole time of the reset/set step BW equal to or larger than T4 and to make current consumption Icc equal to or smaller than A4 (a white circle "b" in FIG. 33).

As for other cases, effects similar to those in the first to third embodiments can be obtained. For example, in a case where the number of simultaneously selected bits at the time of the second reset/set step is made larger than that at the time of the first reset/set step, the bandwidth BW over the whole time of the reset/set step can be increased largely as compared with the case where the number of simultaneously selected bits/bays is fixed as described with reference to FIGS. 17 and 18.

A method for selecting memory cells MC and bays in the case where the number of simultaneously selected bits/bays is changed over depending upon whether it is time for the first reset/set step or for the second reset/set step will now be described briefly.

First, a case where the number of simultaneously selected bits is changed over will now be described.

Figure 34:
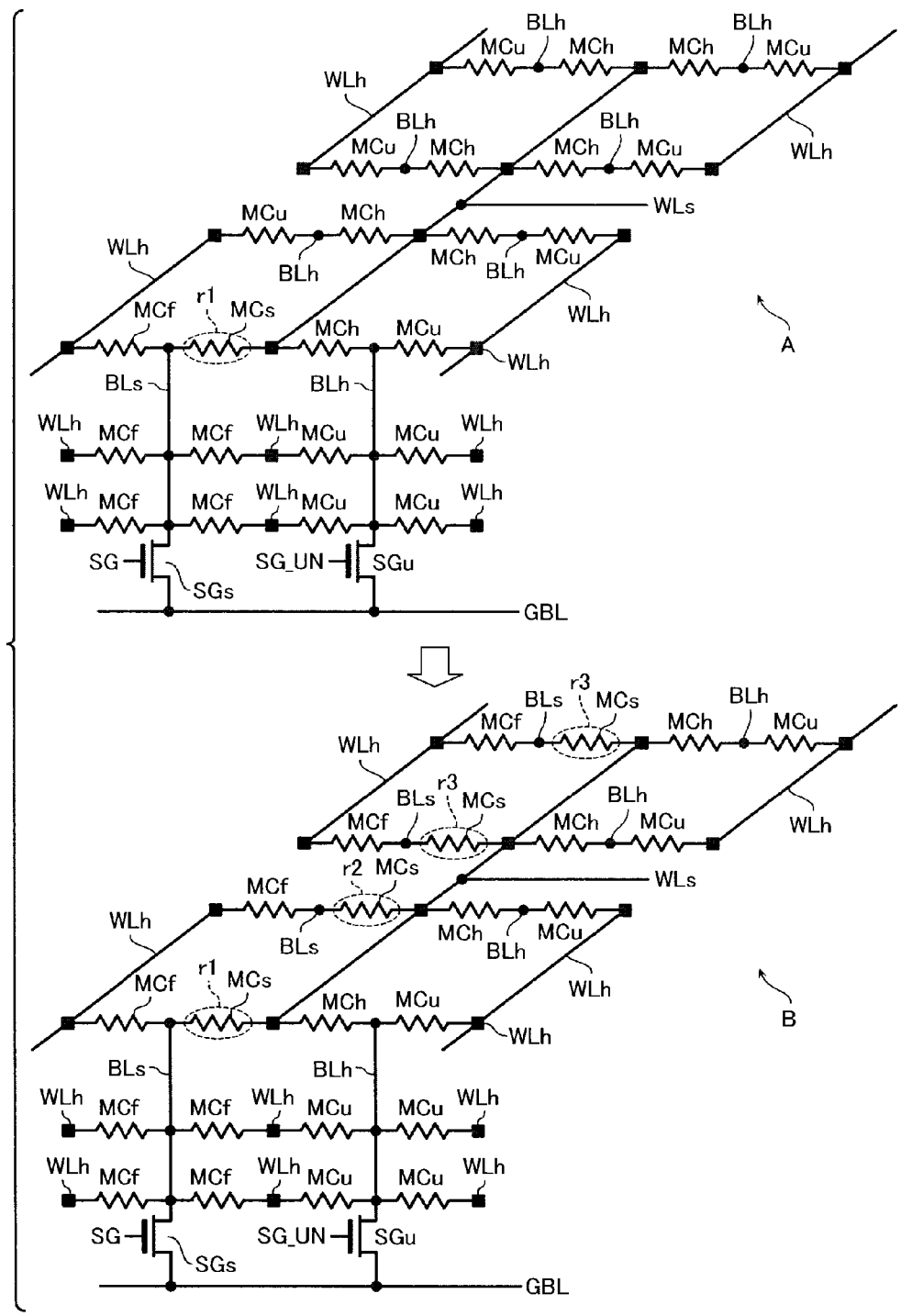
FIG. 34 is an example of a diagram showing bias states in a memory cell array in the nonvolatile semiconductor memory device according to the fourth embodiment.

FIG. 34 is an example of a diagram showing bias states in the memory cell array in the nonvolatile semiconductor memory device according to the present embodiment. In FIG. 34, (A) shows bias states at the time of the first reset/set step and (B) shows bias states at the time of the second reset/set step. FIG. 34 shows an example in a case where the number of simultaneously selected bits is changed from one to four. By the way, in FIG. 34, WLs represents a selected word line, WLh represents an unselected word line, BLs represents a selected bit line, and BLh represents an unselected bit line. MCs represents a selected memory cell, MCh represents a half selected memory cell between a selected word line and an unselected bit line, MCf represents a half selected memory cell between an unselected word line and a selected bit line, and MCu represents an unselected memory cell between an unselected word line and an unselected bit line. SGs represents a selection gate connected to a selected bit line, and SGu represents a selection gate connected to an unselected bit line. GBL represents a global bit line.

At the first reset/set step, only a memory cell indicated by a dashed line ellipse r1 out of one bay is designated as the selected memory cell MCs, as shown in (A) in FIG. 34. In this case, a selection signal SG is input only to the selection gate SGs, and a non-selection signal SG_UN is input to other selection gates SGu. As a result, only the bit line BLs is selected. Furthermore, the word line driver WLDRV sets a selection potential required for the reset/set operation of a memory cell MC on the word line WLs. As a result, it is possible to apply a reset/set pulse only to the memory cell MCs indicated by the dashed line ellipse r1.

At the second reset/set step, four memory cells MCs indicated by dashed line ellipses r1 to r4 are simultaneously selected out of one bay, as shown in (B) in FIG. 34. In this case, a selection signal SG is input to four selection gates SGs (three selection gates SGs are not illustrated), and a non-selection signal SG_UN is input to other selection gates SGu. As a result, four bit lines BLs are selected. Furthermore, the word line driver WLDRV sets a selection potential required for the reset/set operation of a memory cell MC on the word line WLs. As a result, it is possible to apply a reset/set pulse to the four memory cells MCs indicated by the dashed line ellipses r1 to r4.

Subsequently, a case where the number of simultaneously selected bays is changed over will now be described.

Figure 35:
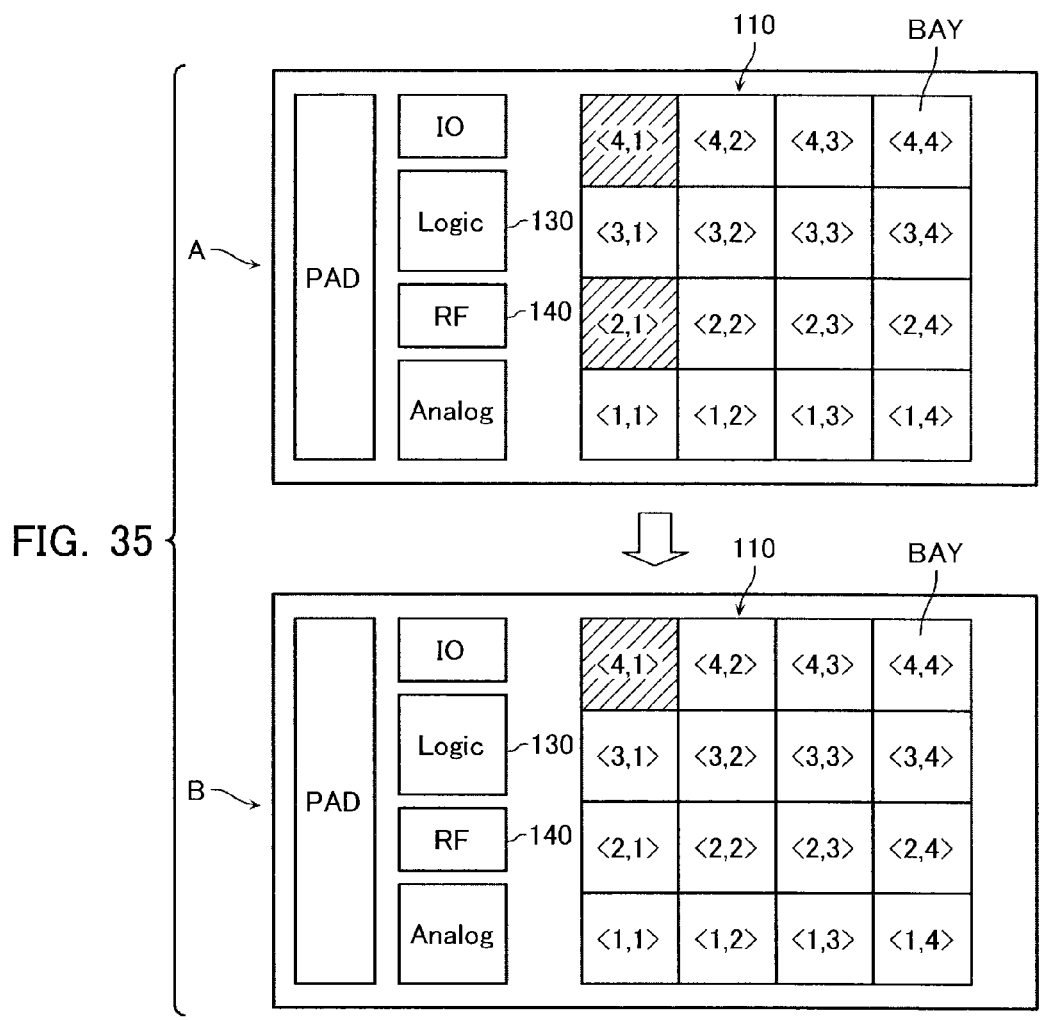
FIG. 35 is an example of a diagram showing selected bays in a memory cell array in the nonvolatile semiconductor memory device according to the fourth embodiment.

FIG. 35 is a diagram showing selected bays in the memory cell array in the nonvolatile semiconductor memory device according to the present embodiment. In FIG. 35, (A) shows selected bays at the time of the first reset/set step, and (B) shows a selected bay at the time of the second reset/set step. FIG. 35 shows an example in a case where the number of simultaneously selected bays is changed from two to one. In this case, two bays <2, 1> and <4, 1> are selected at the first reset/set step as shown in (A) in FIG. 35 and only the bay <4, 1> is selected at the second reset/set step as shown in (B) in FIG. 35.

By the way, in both the case where either of the number of simultaneously selected bits or the number of the simultaneously selected bays is changed over, and the case where both the number of simultaneously selected bits and the number of the simultaneously selected bays are changed over, a write pulse is not applied to error bits (memory cells MCs) at the end of the first reset/set step in the same way as the first to third embodiments.

According to the present embodiment, it is possible to easily adjust the bandwidth BW and the current consumption Icc over the whole time of the reset/set step to suitable values in the same way as the first to third embodiments by changing over the number of simultaneously selected bits/bays at the time of the first reset/set step and the second reset/set step, even in the case where a memory cell array having a 3D structure is used, as described heretofore.

Heretofore, several embodiments of the present invention have been described. However, these embodiments are exhibited as examples and are not intended to restrict the scope of the invention. These novel embodiments can be implemented in various other forms, and various omissions, replacements, and changes may be made without departing from the spirit of the invention. These embodiments and their modifications are incorporated into the scope and spirit of the invention, as well as into the invention stated in claims and its equivalent scope.

What is claimed is:

1. A nonvolatile semiconductor memory device comprising:
   a memory cell array including first interconnections, second interconnections intersecting the first interconnections, and memory cells having a variable resistance element and being provided at respective intersections of the first interconnections and the second interconnections, the memory cell array being divided into bays including a predetermined number of the memory cells; and
   a control circuit configured to execute a first write step and a second write step executed after the first write step at a data writing operation, wherein,
   where the number of the bays selected simultaneously is the number of simultaneously selected bays, and the number of the memory cells selected simultaneously in one of the bays is the number of simultaneously selected bits,
   the control circuit is configured to change over the number of simultaneously selected bits and/or the number of simultaneously selected bays depending upon whether a write step is the first write step or the second write step.

2. The nonvolatile semiconductor memory device according to claim 1, further comprising a data storage element configured to store the number of simultaneously selected bits and the number of simultaneously selected bays at the first write step and at the second write step.

3. The nonvolatile semiconductor memory device according to claim 1, wherein the write step is a reset step of applying a reset pulse to cause a transition of variable resistance elements in the memory cells from a low resistance state to a high resistance state.

4. The nonvolatile semiconductor memory device according to claim 1, wherein the write step is a set step of applying a set pulse to cause a transition of variable resistance elements in the memory cells from a high resistance state to a low resistance state.

5. The nonvolatile semiconductor memory device according to claim 1, wherein the control circuit is configured to make the number of simultaneously selected bits at the second write step equal to the number of simultaneously selected bits at the first write step.

6. The nonvolatile semiconductor memory device according to claim 1, wherein the control circuit is configured to make the number of simultaneously selected bits at the second write step larger than the number of simultaneously selected bits at the first write step.

7. The nonvolatile semiconductor memory device according to claim 1, wherein the control circuit is configured to make the number of simultaneously selected bays at the second write step smaller than the number of simultaneously selected bays at the first write step.

8. The nonvolatile semiconductor memory device according to claim 1, wherein the control circuit is configured to make the number of simultaneously selected bays at the second write step equal to the number of simultaneously selected bays at the first write step.

9. A nonvolatile semiconductor memory device comprising:
   a memory cell array including first interconnections, second interconnections intersecting the first interconnections, and memory cells having a variable resistance element and being provided at respective intersections of the first interconnections and the second interconnections, the memory cell array being divided into bays including a predetermined number of the memory cells; and
   a control circuit configured to execute a first write step and a second write step executed after the first write step at a data writing operation, wherein,
   where the number of the bays selected simultaneously is the number of simultaneously selected bays, the number of the memory cells selected simultaneously in one of the bays is the number of simultaneously selected bits, and the number of the memory cells not written a target data is the number of error bits,
   the control circuit is configured to change over a combination of the number of simultaneously selected bits and the number of simultaneously selected bays at the second write step depending upon the number of error bits.

10. The nonvolatile semiconductor memory device according to claim 9, further comprising a data storage element configured to store the number of simultaneously selected bits and the number of simultaneously selected bays at the second write step.

11. The nonvolatile semiconductor memory device according to claim 9, wherein the write step is a reset step of applying a reset pulse to cause a transition of variable resistance elements in the memory cells from a low resistance state to a high resistance state.

12. The nonvolatile semiconductor memory device according to claim 9, wherein the write step is a set step of applying a set pulse to cause a transition of variable resistance elements in the memory cells from a high resistance state to a low resistance state.

13. The nonvolatile semiconductor memory device according to claim 9, wherein
   in a case where the number of error bits is smaller than a target number, the control circuit is configured to set the number of simultaneously selected bays at the second write step equal to a first number of simultaneously selected bays, and
   in a case where the number of error bits is at least the target number, the control circuit is configured to set the number of simultaneously selected bays at the second write step equal to a second number of simultaneously selected bays which is smaller than the first number of simultaneously selected bays.

14. The nonvolatile semiconductor memory device according to claim 9, wherein the control circuit is configured to set the number of the memory cells simultaneously selected at the second write step in the case where the number of error bits is smaller than a target number equal to the number of the memory cells simultaneously selected at the second write step in the case where the number of error bits is at least the target number.

15. The nonvolatile semiconductor memory device according to claim 1, further comprising a semiconductor substrate, wherein
   the first interconnections extend perpendicularly to a main surface of the semiconductor substrate, and
   the second interconnections extend horizontally to the main surface of the semiconductor substrate.

16. The nonvolatile semiconductor memory device according to claim 15, wherein the control circuit is configured to make the number of simultaneously selected bits at the second write step larger than the number of simultaneously selected bits at the first write step.

17. The nonvolatile semiconductor memory device according to claim 15, wherein the control circuit is configured to make the number of simultaneously selected bays at the second write step smaller than the number of simultaneously selected bays at the first write step.

18. The nonvolatile semiconductor memory device according to claim 9, further comprising a semiconductor substrate, wherein
   the first interconnections extend perpendicularly to a main surface of the semiconductor substrate, and
   the second interconnections extend horizontally to the main surface of the semiconductor substrate.

19. The nonvolatile semiconductor memory device according to claim 18, wherein the control circuit is configured to make the number of simultaneously selected bits at the second write step larger than the number of simultaneously selected bits at the first write step.

20. The nonvolatile semiconductor memory device according to claim 18, wherein the control circuit is configured to make the number of simultaneously selected bays at the second write step smaller than the number of simultaneously selected bays at the first write step.

* * * * *